United States Patent
Sakamoto

(10) Patent No.: US 12,446,464 B2
(45) Date of Patent: Oct. 14, 2025

(54) ORGANIC ELECTROLUMINESCENCE DEVICE AND POLYCYCLIC COMPOUND FOR ORGANIC ELECTROLUMINESCENCE DEVICE

(71) Applicant: Samsung Display Co., LTD., Yongin-si (KR)

(72) Inventor: Naoya Sakamoto, Yokohama (JP)

(73) Assignee: Samsung Display Co., Ltd., Yongin-si (KR)

(*) Notice: Subject to any disclaimer, the term of this patent is extended or adjusted under 35 U.S.C. 154(b) by 705 days.

(21) Appl. No.: 16/996,824

(22) Filed: Aug. 18, 2020

(65) Prior Publication Data
US 2021/0057652 A1    Feb. 25, 2021

(30) Foreign Application Priority Data

Aug. 23, 2019  (KR) .................. 10-2019-0103374

(51) Int. Cl.
*C07D 209/86*  (2006.01)
*C07D 405/14*  (2006.01)
(Continued)

(52) U.S. Cl.
CPC ....... *H10K 85/6572* (2023.02); *C07D 209/86* (2013.01); *C07D 405/14* (2013.01); (Continued)

(58) Field of Classification Search
CPC .............. H10K 85/6572; C07D 209/82; C07D 209/86; H01L 51/0074
See application file for complete search history.

(56) References Cited

U.S. PATENT DOCUMENTS 9,093,650 B2  7/2015  Kim et al.
9,306,175 B2  4/2016  Yokoyama et al.
(Continued)

FOREIGN PATENT DOCUMENTS

CN  107573323  1/2018
CN  107698489  2/2018
(Continued)

OTHER PUBLICATIONS

CN-107746383-A—translation (Year: 2018).*
(Continued)

*Primary Examiner* — Jennifer A Boyd
*Assistant Examiner* — Rachel Simbana
(74) *Attorney, Agent, or Firm* — Womble Bond Dickinson (US) LLP

(57) ABSTRACT

An organic electroluminescence device includes: a first electrode; a second electrode disposed on the first electrode; and at least one organic layer disposed between the first electrode and the second electrode. wherein the at least one organic layer includes a polycyclic compound having a core structure including a n,n'-bicarbazole moiety and, outside the core structure, at least one optionally substituted carbazole group, and the substituted or unsubstituted carbazole groups of the core structure substituted at any one among carbon atoms at position n±1 of the n,n'-bicarbazole moiety, and any one among carbon atoms at position n'±1 of the n,n'-bicarbazole moiety, respectively; and n and n' are, independently from one another, integers of 1 to 4 (where n±1 and n'±1 are not 0).

23 Claims, 2 Drawing Sheets

(51) Int. Cl.
   *C07D 409/14* (2006.01)
   *C09K 11/06* (2006.01)
   *H10K 50/11* (2023.01)
   *H10K 50/14* (2023.01)
   *H10K 50/15* (2023.01)
   *H10K 50/16* (2023.01)
   *H10K 85/60* (2023.01)
   *H10K 101/10* (2023.01)
   *H10K 101/30* (2023.01)

(52) U.S. Cl.
   CPC ............ *C07D 409/14* (2013.01); *C09K 11/06* (2013.01); *H10K 85/6574* (2023.02); *H10K 85/6576* (2023.02); *C09K 2211/1018* (2013.01); *H10K 50/11* (2023.02); *H10K 50/15* (2023.02); *H10K 50/16* (2023.02); *H10K 2101/10* (2023.02); *H10K 2101/30* (2023.02)

(56) References Cited

U.S. PATENT DOCUMENTS

| | | | |
|---|---|---|---|
| 9,997,711 B2 | 6/2018 | Shin et al. | |
| 10,062,853 B2 | 8/2018 | Jung et al. | |
| 10,326,111 B2 | 6/2019 | Yoo et al. | |
| 10,454,056 B1 | 10/2019 | Chun et al. | |
| 2009/0242876 A1* | 10/2009 | Brunner | C07D 209/88 548/440 |
| 2015/0194622 A1* | 7/2015 | Yamamoto | H10K 85/381 257/40 |
| 2015/0340623 A1* | 11/2015 | Kawamura | C07D 491/048 257/40 |
| 2017/0018600 A1 | 1/2017 | Ito et al. | |
| 2017/0200899 A1 | 7/2017 | Kim et al. | |
| 2017/0317292 A1* | 11/2017 | Cheng | H10K 85/654 |
| 2017/0365796 A1 | 12/2017 | Kim et al. | |

FOREIGN PATENT DOCUMENTS

| | | | |
|---|---|---|---|
| CN | 107746383 | 3/2018 | |
| CN | 107746383 A * | 3/2018 | |
| JP | 2004311415 | 11/2004 | |
| KR | 10-1513696 | 4/2015 | |
| KR | 10-2015-0134248 | 12/2015 | |
| KR | 10-2017-0089095 | 8/2017 | |
| KR | 10-2017-0139339 | 12/2017 | |
| KR | 10-2017-0142066 | 12/2017 | |
| KR | 10-1843589 | 3/2018 | |
| WO | 2011/048822 | 4/2011 | |
| WO | WO-2012128298 A1 * | 9/2012 | ........... C07D 209/86 |
| WO | WO-2016105161 A2 * | 6/2016 | ........... C07D 209/82 |
| WO | 2018/182145 | 10/2018 | |

OTHER PUBLICATIONS

WO-2012128298-A1 (Year: 2012).*
WO-2016105161-A2—translation (Year: 2016).*
Extended European Search Report dated Oct. 23, 2020, issued in European Patent Application No. 20189040.7.
Kyoko Nozaki et al., The Double N-Arylation of Primary Amines: Toward Multisubstituted Carbazoles with Unique Optical Properties, Angewandte Chemie, May 9, 2003, vol. 42, pp. 2051-2053.

* cited by examiner

ORGANIC ELECTROLUMINESCENCE DEVICE AND POLYCYCLIC COMPOUND FOR ORGANIC ELECTROLUMINESCENCE DEVICE

CROSS REFERENCE TO RELATED APPLICATION

This application claims priority from and the benefit of Korean Patent Application No. 10-2019-0103374, filed Aug. 23, 2019, which is hereby incorporated by reference for all purposes as if fully set forth herein.

BACKGROUND

Field

Exemplary implementations of the invention relate generally to organic electroluminescence devices and, more particularly, to a polycyclic compound for organic electroluminescence devices.

Discussion of the Background

The development of an organic electroluminescence device as an image display device is being actively conducted. Contrary to a liquid crystal display device, the organic electroluminescence device is so-called a self-luminescent display device in which holes and electrons injected from a first electrode and a second electrode recombine in an emission layer, and a light-emitting material which is an organic compound included in the emission layer emits light to achieve display.

In the application of an organic electroluminescence to display devices, increase in the efficiency and life of the organic electroluminescence device is required, and development of materials for an organic electroluminescence device to stably meet these requirements is ongoing.

The above information disclosed in this Background section is only for understanding of the background of the inventive concepts, and, therefore, it may contain information that does not constitute prior art.

SUMMARY

Organic electroluminescence devices and polycyclic compounds used in the same constructed according to the principles and exemplary implementations of the invention have high efficiency and long life.

Additional features of the inventive concepts will be set forth in the description which follows, and in part will be apparent from the description, or may be learned by practice of the inventive concepts.

According to one aspect of the invention, an organic electroluminescence device, includes:
a first electrode;
a second electrode disposed on the first electrode; and
at least one organic layer disposed between the first electrode and the second electrode;
wherein the at least one organic layer includes a polycyclic compound having a core structure including a n,n'-bicarbazole moiety and, outside the core structure, at least one optionally substituted carbazole group, and the substituted or unsubstituted carbazole groups of the core structure substituted at any one among carbon atoms at position n±1 of the n,n'-bicarbazole moiety, and any one among carbon atoms at position n'±1 of the n,n'-bicarbazole moiety, respectively; and
n and n' are, independently from one another, integers of 1 to 4 (where n±1 and n'±1 are not 0).

The variables n and n' may be the same; and the substituted or unsubstituted carbazole groups of the core structure substituted at a carbon atom at position n+1 of the n,n'-bicarbazole moiety and a carbon atom at position n'+1 of the n,n'-bicarbazole moiety, respectively, or at a carbon atom at position n−1 of the n,n'-bicarbazole moiety and a carbon atom at position n'−1 of the n,n'-bicarbazole moiety, respectively.

The polycyclic compound may have a symmetrical structure about a connecting group of the n,n'-bicarbazole moiety; and the connecting group may be a group connecting two carbazole groups at carbon at position n and carbon at position n' of the n,n'-bicarbazole moiety via a direct bond.

The nitrogen at position 9 of the at least one optionally substituted carbazole group may be bonded to the n,n'-bicarbazole moiety.

The energy level of a highest occupied molecular orbital of the polycyclic compound may be from about −5.50 eV to about −5.00 eV.

The lowest excitation triplet energy level of the polycyclic compound may be about 3.00 eV to about 3.20 eV.

The at least one organic layer may include: a hole transport region including the polycyclic compound disposed on the first electrode; an emission layer disposed on the hole transport region; and an electron transport region disposed between the emission layer and the second electrode.

The emission layer may be configured to emit thermally activated delayed fluorescence.

The emission layer may be configured to emit blue light.

The polycyclic compound may be represented by the following Formula 1:

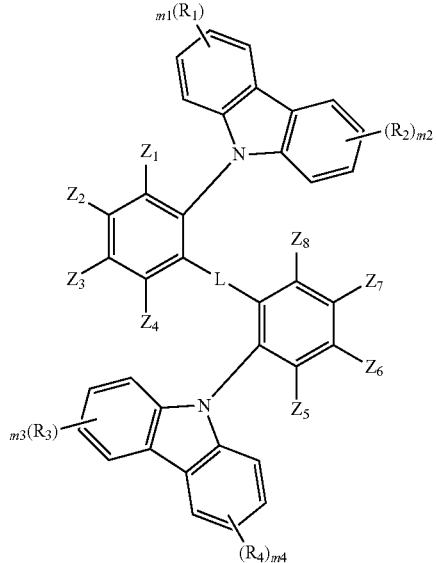

[Formula 1]

in Formula 1,
L may be a direct linkage;
$R_1$ to $R_4$ may each be, independently from one another, a hydrogen atom, a deuterium atom, a halogen atom, a substituted or unsubstituted amino group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, or combined with an adjacent group to form a ring;

m1 to m4 may each be, independently from one another, an integer of 1 to 4;

$Z_1$ to $Z_8$ may each be, independently from one another, a hydrogen atom, a deuterium atom, a halogen atom, a substituted or unsubstituted amino group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, or combined with an adjacent group to form a ring; and at least one pair among $Z_1$ and $Z_2$, $Z_2$ and $Z_3$, and $Z_3$ and $Z_4$ may be represented by the following Formula 2-1, and at least one pair among $Z_5$ and $Z_6$, $Z_6$ and $Z_7$, and $Z_7$ and $Z_8$ may be represented by the following Formula 2-2:

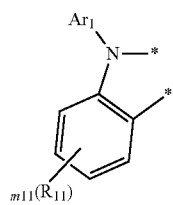

[Formula 2-1]

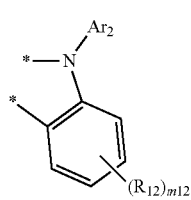

[Formula 2-2]

in Formulae 2-1 and 2-2, $R_{11}$, and $R_{12}$ may each be, independently from one another, a hydrogen atom, a deuterium atom, a halogen atom, a substituted or unsubstituted amino group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, or combined with an adjacent group to form a ring;

m11 and m12 may each be, independently from one another, an integer of 1 to 4; and $Ar_1$ and $Ar_2$ may each be, independently from one another, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring.

Formula 1 may have a symmetrical structure about L.

The compound of Formula 1 may be represented by one or more compounds of the following Formulae 1-1 to 1-6, as defined herein.

The variables $R_1$ to $R_4$ may be the same, and $Ar_1$ and $Ar_2$ may be the same.

The polycyclic compound may include at least one compound from the Compound Group 1, as defined herein.

The organic layer may include a functional group and the n,n'-bicarbazole moiety may include a n,n'-bicarbazole derivative.

According to another aspect of the invention, an organic electroluminescence device, includes: a first electrode; a second electrode disposed on the first electrode; and at least one organic layer disposed between the first electrode and the second electrode; wherein the organic layer includes a polycyclic compound represented by the Formula 1, defined above.

Formula 1 may have a symmetrical structure about L.

The compound of Formula 1 may be represented by one or more compounds of the following Formulae 1-1 to 1-6, as defined herein.

The variables $R_1$ to $R_4$ may be the same, and $Ar_1$ and $Ar_2$ may be the same.

According to a further aspect of the invention, a polycyclic compound represented by Formula 1, defined above.

Formula 1 may have a symmetrical structure about L.

The compound of Formula 1 may be represented by one or more compounds of the following Formulae 1-1 to 1-6, as defined herein.

The variables $R_1$ to $R_4$ may be the same, and $Ar_1$ and $Ar_2$ may be the same.

The polycyclic compound may include at least one compound from the Compound Group 1, as defined herein.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
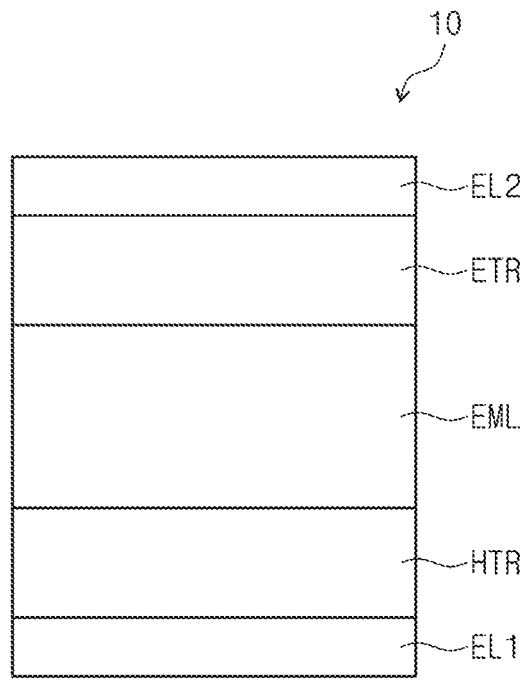
FIG. 1 is a cross-sectional view of an exemplary embodiment schematically illustrating an organic electroluminescence device constructed according to principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements, such as a layer, a film, a region, a plate, etc., relationship to another element(s) as illustrated in the drawings. Spatially relative terms are intended to encompass different orientations of a device or an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

As used herein, the term "substituted or unsubstituted" corresponds to substituted or unsubstituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkoxy group, a hydrocarbon ring group, an aryl group, and a heterocyclic group. In addition, each of the substituents may be substituted or unsubstituted. For example, a biphenyl group may be interpreted as an aryl group or a phenyl group substituted with a phenyl group.

As used herein, the term "forming a ring via the combination with an adjacent group" may mean forming a substituted or unsubstituted hydrocarbon ring, or a substituted or unsubstituted heterocycle via the combination with an adjacent group. The hydrocarbon ring includes an aliphatic hydrocarbon ring and an aromatic hydrocarbon ring. The heterocycle includes an aliphatic heterocycle and an aromatic heterocycle. The hydrocarbon ring and heterocycle may be a monocycle or a polycycle. In addition, the ring formed via the combination with each other may be combined with another ring to form a spiro structure.

As used herein, the term "adjacent group" may mean a substituent substituted for an atom which is directly combined with an atom substituted with a corresponding substituent, another substituent substituted for an atom which is substituted with a corresponding substituent, or a substituent sterically positioned at the nearest position to a corresponding substituent. For example, in 1,2-dimethylbenzene, two methyl groups may be interpreted as "adjacent groups" to each other, and in 1,1-diethylcyclopentene, two ethyl groups may be interpreted as "adjacent groups" to each other.

As used herein, the halogen atom may be a fluorine atom, a chlorine atom, a bromine atom or an iodine atom. Moreover, the terms "hydrogen," "deuterium," "fluorine," "chlorine," "bromine," and "iodine" refer to their respective atoms and corresponding radicals.

As used herein, the alkyl may be a linear, branched or cyclic type. The carbon number of the alkyl may be 1 to 50, 1 to 30, 1 to 20, 1 to 10, or 1 to 6. Examples of the alkyl may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldodecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

As used herein, the hydrocarbon ring group means an optional functional group or substituent derived from an aliphatic hydrocarbon ring. The hydrocarbon ring group may be a saturated hydrocarbon ring group of 5 to 20 carbon atoms for forming a ring.

As used herein, the aryl group means an optional functional group or substituent derived from an aromatic hydrocarbon ring. The aryl group may be a monocyclic aryl group or a polycyclic aryl group. The carbon number for forming a ring in the aryl group may be 6 to 30, 6 to 20, or 6 to 15. Examples of the aryl group may include phenyl, naphthyl, fluorenyl, anthracenyl, phenanthryl, biphenyl, terphenyl, quaterphenyl, quinquephenyl, sexiphenyl, triphenylenyl, pyrenyl, benzofluoranthenyl, chrysenyl, etc., without limitation.

As used herein, the heterocyclic group may include one or more among B, 0, N, P, Si and S as heteroatoms. If the heterocyclic group includes two or more heteroatoms, two or more heteroatoms may be the same or different. The heterocyclic group may be a monocyclic heterocyclic group or a polycyclic heterocyclic group, and includes, e.g., a heteroaryl group. The carbon number for forming a ring of the heteroaryl group may be 2 to 30, 2 to 20, or 2 to 10.

As used herein, the carbon number for forming a ring of the heteroaryl group may be 2 to 30, 2 to 20, or 2 to 10. Examples of the heteroaryl group may include thiophene, furan, pyrrole, imidazole, thiazole, oxazole, oxadiazole, triazole, pyridine, bipyridine, pyrimidine, triazine, triazole, acridyl, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophene, thienothiophene, benzofuran, phenanthroline, isooxazole, oxadiazole, thiadiazole, phenothiazine, dibenzosilole, dibenzofuran, etc., without limitation.

As used herein, the carbon number of the amino group is not specifically limited, but may be 1 to 30. The amino group may include an alkyl amino group, an aryl amino group, or a heteroaryl amino group. Examples of the amino group include a methylamino group, a dimethylamino group, a phenylamino group, a diphenyamino group, a naphthylamino group, a 9-methyl-anthracenylamino group, a triphenylamino group, etc., without limitation.

As used herein, the alkenyl group may be a linear chain or a branched chain. The carbon number is not specifically limited but may be 2 to 30, 2 to 20, or 2 to 10. Examples of the alkenyl group may include a vinyl group, a 1-butenyl group, a 1-pentenyl group, a 1,3-butadienyl aryl group, a styrenyl group, a styrylvinyl group, etc., without limitation.

As used herein, the term "moiety" means a portion of a compound.

In the description, "-*" means a connected position.

As used herein, the direct linkage may mean a single bond.

Figure 2:
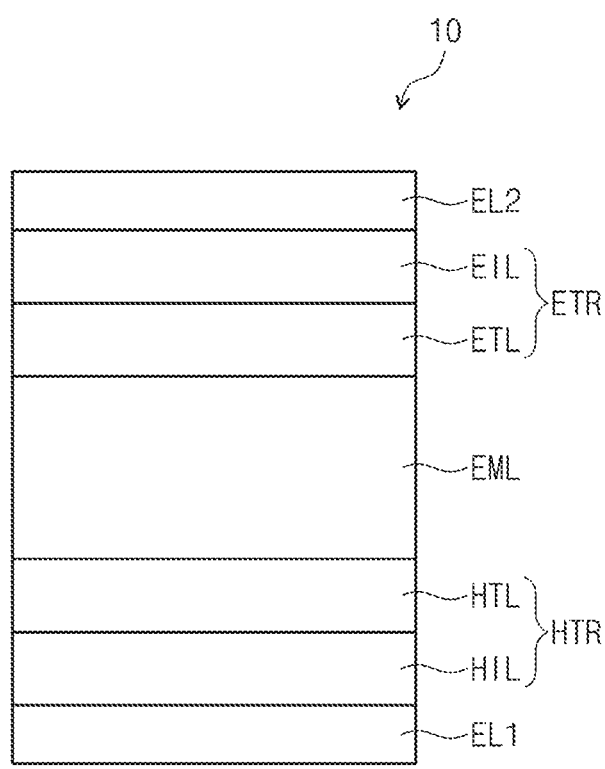
FIG. 2 is a cross-sectional view of another exemplary embodiment schematically illustrating organic electroluminescence device constructed according to principles of the invention.
Figure 3:
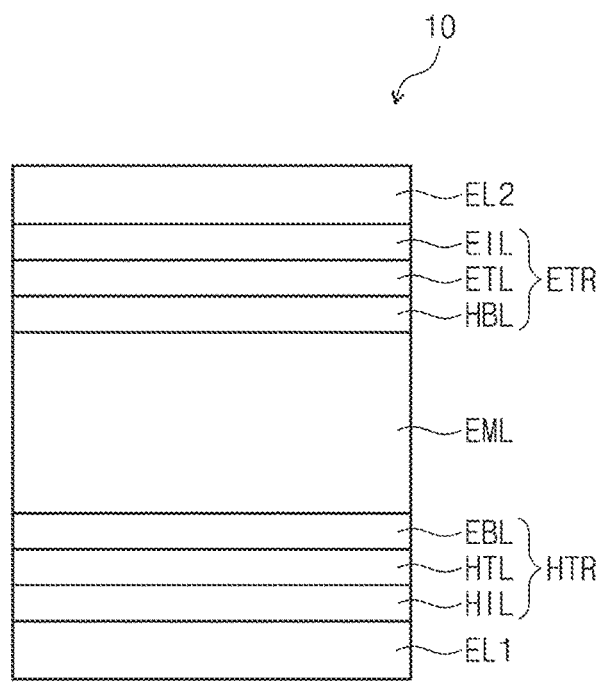
FIG. 3 is a cross-sectional view of a further exemplary embodiment schematically illustrating an organic electroluminescence device constructed according to principles of the invention.
Figure 4:
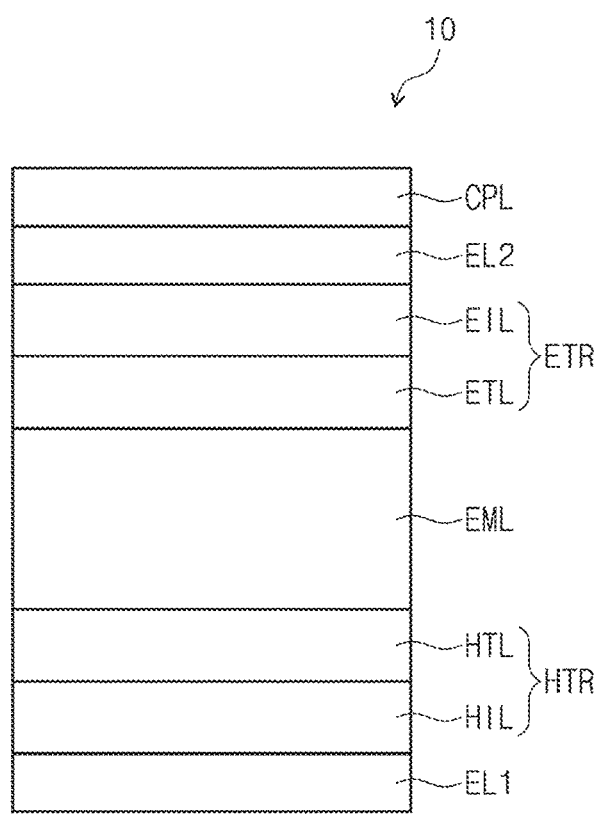
FIG. 4 is a cross-sectional view of still another exemplary embodiment schematically illustrating organic electroluminescence device constructed according to principles of the invention.

FIG. 1 is a cross-sectional view of an exemplary embodiment schematically illustrating an organic electroluminescence device constructed according to principles of the invention. FIG. 2 is a cross-sectional view of another exemplary embodiment schematically illustrating organic electroluminescence device constructed according to principles of the invention. FIG. 3 is a cross-sectional view of a further exemplary embodiment schematically illustrating an organic electroluminescence device constructed according to principles of the invention. FIG. 4 is a cross-sectional view of still another exemplary embodiment schematically illustrating organic electroluminescence device constructed according to principles of the invention.

Referring to FIG. 1, an organic electroluminescence device 10 according to an exemplary embodiment may include a first electrode EL1, at least one organic layer, and a second electrode EL2 stacked in order. The organic layer may be an organic layer including an organic material, but exemplary embodiments are not limited thereto. For example, the organic layer may include a metal-containing compound such as at least one of a lanthanide metal, a metal halide and a metal oxide. Also, the organic layer may include an inorganic material such as at least one of a quantum dot and a quantum rod.

The at least one organic layer may include at least one of a hole transport region HTR, an emission layer EML, or an electron transport region ETR as discussed in further detail below.

Referring to FIGS. 1 to 4, in an organic electroluminescence device 10 according to an exemplary embodiment, a first electrode EL1 and a second electrode EL2 are oppositely disposed, and between the first electrode EL1 and the second electrode EL2, an emission layer EML may be disposed.

In addition, the organic electroluminescence device 10 further includes a plurality of organic layers between the first electrode EL1 and the second electrode EL2 in addition to the emission layer EML. The plurality of the organic layers may include the hole transport region HTR and an electron transport region ETR. That is, the organic electroluminescence device 10 may include the first electrode EL1, the hole transport region HTR, the emission layer EML, the electron transport region ETR, and the second electrode EL2, stacked in order. In addition, the organic electroluminescence device 10 may include a capping layer CPL which is disposed on the second electrode EL2, as depicted in FIG. 4.

The organic electroluminescence device 10 may include a polycyclic compound, which be described in further detail below, in the hole transport region HTR which is disposed between the first electrode EL1 and the second electrode EL2. However, exemplary embodiments are not limited thereto, and the organic electroluminescence device 10 of some exemplary embodiments may include a polycyclic compound, which is explained in further detail below, in the emission layer EML or in the electron transport region ETR, which is the organic layer disposed between the first electrode EL1 and the second electrode EL2, or includes the polycyclic compound, which will be explained in further detail below, in the capping layer CPL disposed on the second electrode EL2 in addition to the hole transport region HTR.

When compared with FIG. 1, FIG. 2 shows the cross-sectional view of an organic electroluminescence device 10, wherein the hole transport region HTR includes a hole injection layer HIL and a hole transport layer HTL, and the electron transport region ETR includes an electron injection layer EIL and an electron transport layer ETL. In addition, when compared with FIG. 1, FIG. 3 shows the cross-sectional view of an exemplary embodiment of the organic electroluminescence device 10, where the hole transport region HTR includes the hole injection layer HIL, the hole transport layer HTL, and an electron blocking layer EBL, and the electron transport region ETR includes the electron injection layer EIL, the electron transport layer ETL, and a hole blocking layer HBL. When compared with FIG. 1, FIG. 4 shows the cross-sectional view of an exemplary embodiment of an organic electroluminescence device 10, including the capping layer CPL disposed on the second electrode EL2.

The at least one organic layer may include the polycyclic compound. The polycyclic compound according to may include a core structure and a substituent substituted at the core structure. The core structure may include an n,n'-bicarbazole moiety In at least some exemplary embodiments, the n,n'-bicarbazole moiety may be in the form of a n,n'-bicarbazole derivative.

The substituent substituted at the core structure may be a substituted or unsubstituted carbazole group. The substituted or unsubstituted carbazole groups may be substituted at any one among carbon atoms at position n±1 of the n,n'-bicarbazole moiety, and any one among carbon atoms at position n'±1, respectively. Nitrogen at position 9 of the substituted or unsubstituted carbazole group may be bonded to and substituted at the n,n'-bicarbazole moiety.

The variables n and n' may be integers of 1 to 4, n±1 and n'±1 may not be 0, and n and n' may be the same. For example, the core structure may be 1,1-bicarbazole moiety, 2,2-bicarbazole moiety, 3,3-bicarbazole moiety, or 4,4-bicarbazole moiety.

The substituted or unsubstituted carbazole groups substituted at the core structure may be substituted at carbon at position n+1 and carbon at position n'+1 of the n,n'-bicarbazole moiety, respectively, or may be substituted at carbon at position n−1 and at carbon at position n'−1 of the n,n'-bicarbazole moiety, respectively.

The polycyclic compound may have a symmetrical or asymmetrical structure about a connecting group of the n,n'-bicarbazole moiety. The connecting group means a group connecting two carbazole groups via a direct linkage at carbon at position n and at carbon at position n' of the n,n'-bicarbazole moiety. If the polycyclic compound has a symmetrical structure, it may have a line symmetry or point symmetry structure about the connecting group of the n,n'-bicarbazole moiety.

The polycyclic compound may be represented by the following Formula 1:

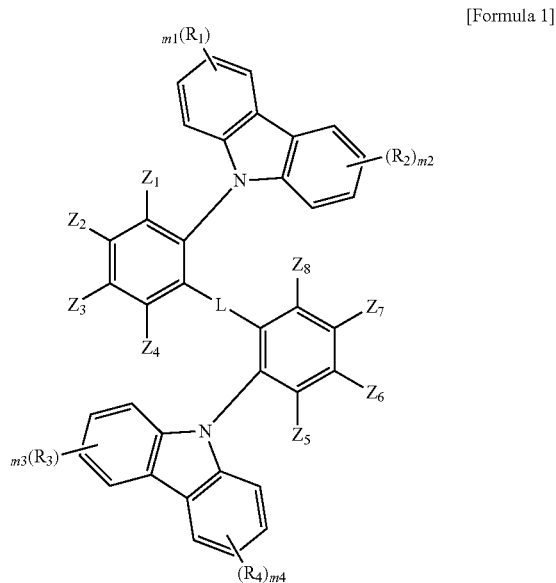

[Formula 1]

In Formula 1, Formula A may be defined as a core structure.

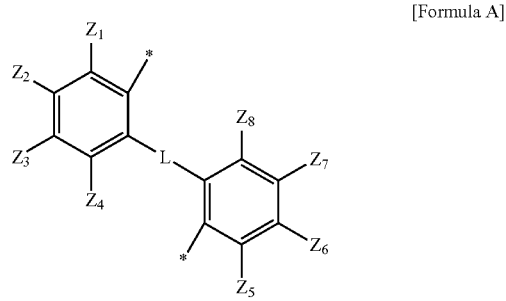

[Formula A]

In Formula A, "-*" means a connected position with a substituted or unsubstituted carbazole substituent.

In Formula 1, L may be a direct linkage. $R_1$ to $R_4$ may be each independently a hydrogen atom, a deuterium atom, a halogen atom, an amino group, an alkyl group, an aryl group, or a heteroaryl group, or combined with an adjacent group to form a ring. The amino group may be a substituted or unsubstituted amino group. The alkyl group may be a substituted or unsubstituted alkyl group of 1 to 20 carbon atoms. The aryl group may be a substituted or unsubstituted aryl group of 6 to 30 carbon atoms for forming a ring. The heteroaryl group may be a substituted or unsubstituted heteroaryl group of 2 to 30 carbon atoms for forming a ring.

For example, $R_1$ to $R_4$ may be each independently a substituted or unsubstituted methyl group, a substituted or unsubstituted ethyl group, or a substituted or unsubstituted phenyl group. All $R_1$ to $R_4$ may be the same.

m1 to m4 may be each independently an integer of 1 to 4. m1 to m4 may be the same or different. For example, all m1 to m4 may be the same. m1 and m4 may be the same. m2 and m3 may be the same.

If m1 is an integer of 2 or more, a plurality of $R_1$ groups may be the same or different. The same explanation on m1 may be applied to m2 to m4.

$Z_1$ to $Z_8$ may be each independently a hydrogen atom, a deuterium atom, a halogen atom, an amino group, an alkyl group, an aryl group, or a heteroaryl group, or combined with an adjacent group to form a ring. The amino group may be a substituted or unsubstituted amino group. The alkyl group may be a substituted or unsubstituted alkyl group of 1 to 20 carbon atoms. The aryl group may be a substituted or unsubstituted aryl group of 6 to 30 carbon atoms for forming a ring. The heteroaryl group may be a substituted or unsubstituted heteroaryl group of 2 to 30 carbon atoms for forming a ring.

At least one pair among $Z_1$ and $Z_2$, $Z_2$ and $Z_3$, and $Z_3$ and $Z_4$ is represented by the following Formula 2-1, and at least one pair among $Z_5$ and $Z_6$, $Z_6$ and $Z_7$, and $Z_7$ and $Z_8$ may be represented by the following Formula 2-2:

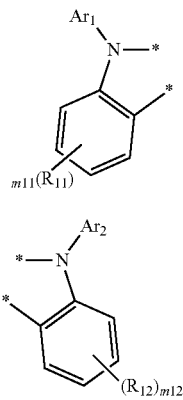

[Formula 2-1]

[Formula 2-2]

In Formulae 2-1 and 2-2, $R_{11}$ and $R_{12}$ may be each independently a hydrogen atom, a deuterium atom, a halogen atom, an amino group, an alkyl group, an aryl group, or a heteroaryl group, or combined with an adjacent group to form a ring. The amino group may be a substituted or unsubstituted amino group. The alkyl group may be a substituted or unsubstituted alkyl group of 1 to 20 carbon atoms. The aryl group may be a substituted or unsubstituted aryl group of 6 to 30 carbon atoms for forming a ring. The heteroaryl group may be a substituted or unsubstituted heteroaryl group of 2 to 30 carbon atoms for forming a ring.

The variables m11 and m12 may be each independently an integer of 1 to 4, and m11 and m12 may be the same or different. If m11 is an integer of 2 or more, a plurality of $R_{11}$ groups may be the same or different. If m12 is an integer of 2 or more, a plurality of $R_{12}$ groups may be the same or different.

$Ar_1$ and $Ar_2$ may be each independently an alkyl group, an aryl group, or a heteroaryl group. The alkyl group may be a substituted or unsubstituted alkyl group of 1 to 20 carbon atoms. The aryl group may be a substituted or unsubstituted aryl group of 6 to 30 carbon atoms for forming a ring. The heteroaryl group may be a substituted or unsubstituted heteroaryl group of 2 to 30 carbon atoms for forming a ring.

For example, $Ar_1$ and $Ar_2$ may be each independently a substituted or unsubstituted methyl group, a substituted or unsubstituted ethyl group, a substituted or unsubstituted phenyl group, or a substituted or unsubstituted dibenzoheterocyclic group. The dibenzoheterocyclic group may include, for example, a substituted or unsubstituted dibenzofuran group, a substituted or unsubstituted dibenzothiophene group, or a substituted or unsubstituted carbazole group. $Ar_1$ and $Ar_2$ may be the same.

In Formula 2-1 and Formula 2-2, "-*" means a position connected with Formula 1.

Formula 1 may be represented by the following Formula 1-A:

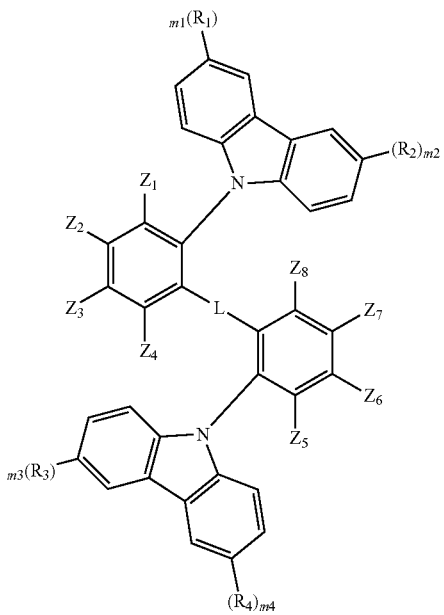

[Formula 1-A]

Formula 1-A is a chemical formula in which the substitution positions of $R_1$ to $R_4$ in Formula 1 are defined. In Formula 1-A, L, $R_1$ to $R_4$, m1 to m4, and Z1 to Z8 may be defined as the same manner in Formula 1.

Formula 2-1 and Formula 2-2 may be each independently represented by the following Formulae 3-1 to 3-3:

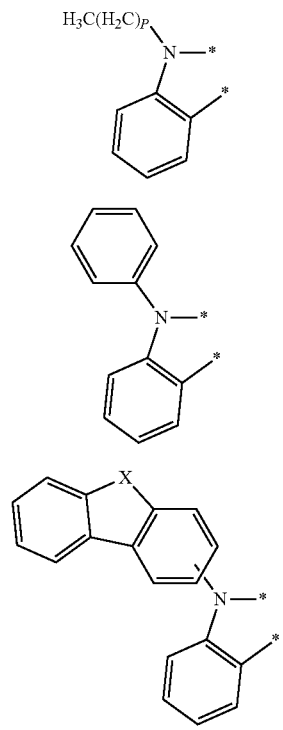

[Formula 3-1]

[Formula 3-2]

[Formula 3-3]

In Formula 3-1, p may be an integer of 0 to 5. In Formula 3-3, X may be O, $NR_{1-1}$, or S. $R_{1-1}$ may be a substituted or unsubstituted alkyl group of 1 to 20 carbon atoms, or a substituted or unsubstituted aryl group of 6 to 30 carbon atoms for forming a ring. $R_{1-1}$ may be, for example, a phenyl group.

Formula 1 may have a symmetrical structure or an asymmetrical structure about L. Formula 1 may have a line symmetry or point symmetry structure about L.

Formula 1 may be represented by the following Formulae 1-1 to 1-6:

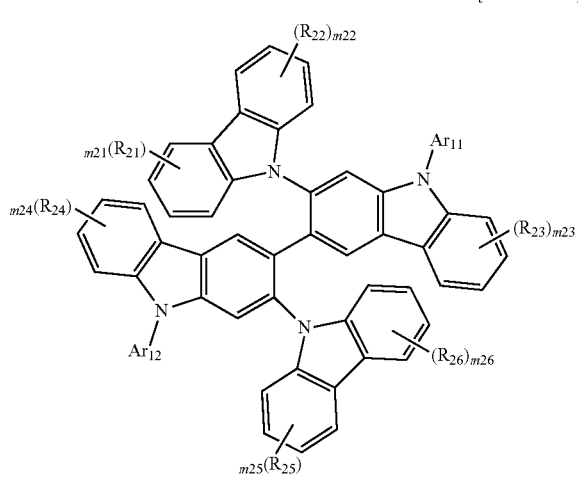

[Formula 1-1]

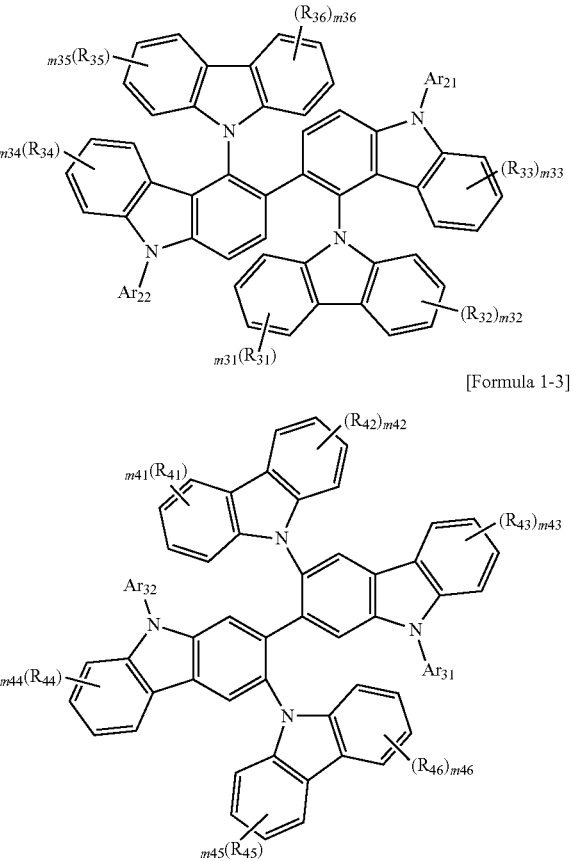

[Formula 1-2]

[Formula 1-3]

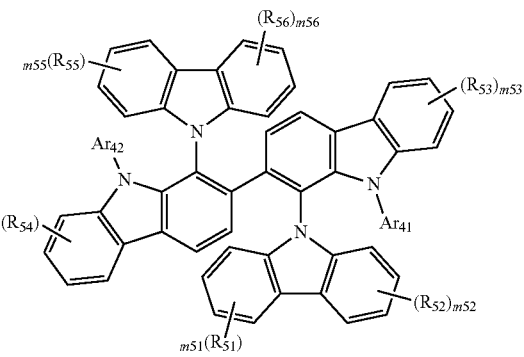

[Formula 1-4]

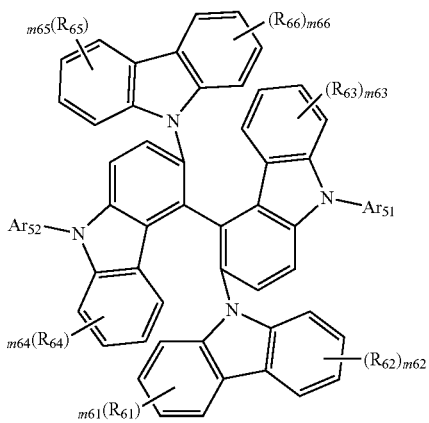

[Formula 1-5]

-continued

[Formula 1-6]

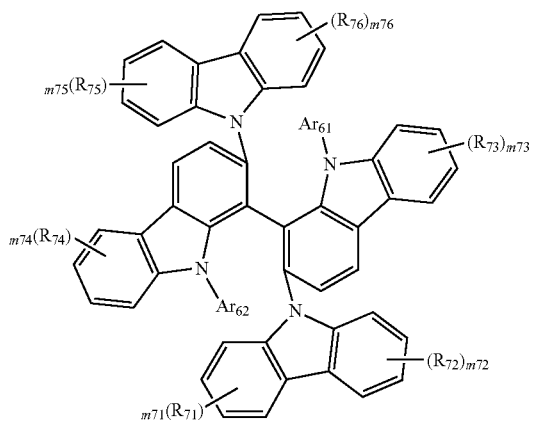

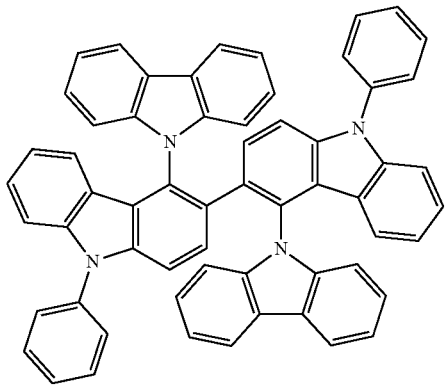

2

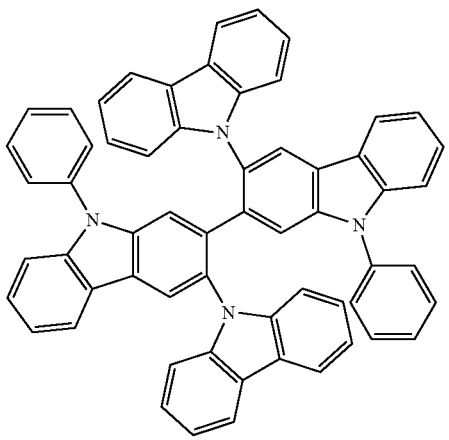

3

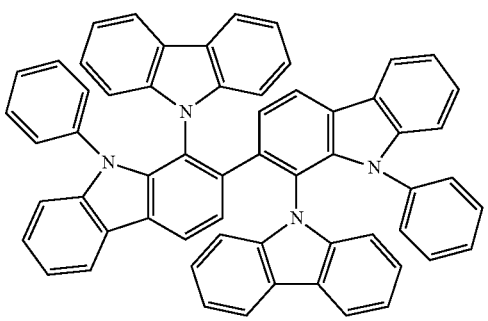

4

In Formulae 1-1 to 1-6, each of $R_{21}$ to $R_{26}$, $R_{31}$ to $R_{36}$, $R_{41}$ to $R_{46}$, $R_{51}$ to $R_{56}$, $R_{61}$ to $R_{66}$, and $R_{71}$ to $R_{76}$ may be defined in the same manner as $R_1$ to $R_4$, which are defined in Formula 1.

m21 to m26, m31 to m36, m41 to m46, m51 to m56, m61 to m66, and m71 to m76 may be defined in the same manner as m1 to m4, which are defined in Formula 1.

Each of $Ar_{11}$ and $Ar_{12}$, $Ar_{21}$ and $Ar_{22}$, $Ar_{31}$ and $Ar_{32}$, $Ar_{41}$ and $Ar_{42}$, $Ar_{51}$ and $Ar_{52}$, and $Ar_{61}$ and $Ar_{62}$ may be defined in the same manner as $Ar_1$ and $Ar_2$, which are defined in Formula 1.

Formula 1 may include at least one among the compounds represented in the following Compound Group 1:

[Compound Group 1]

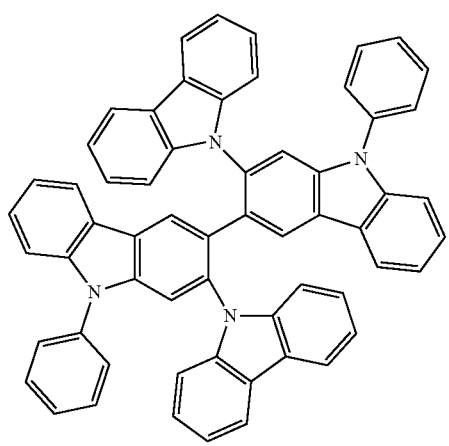

1

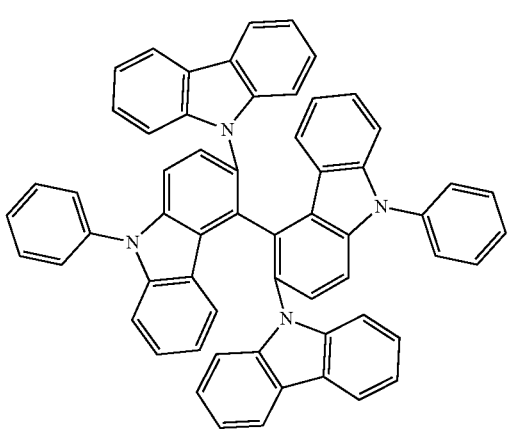

5

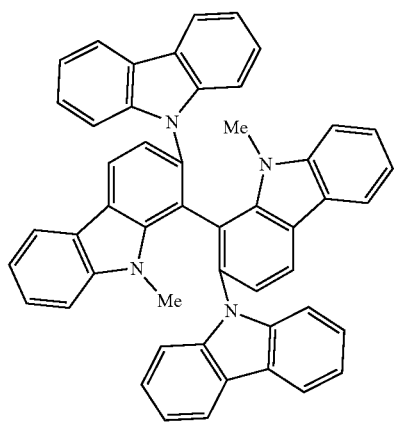
6
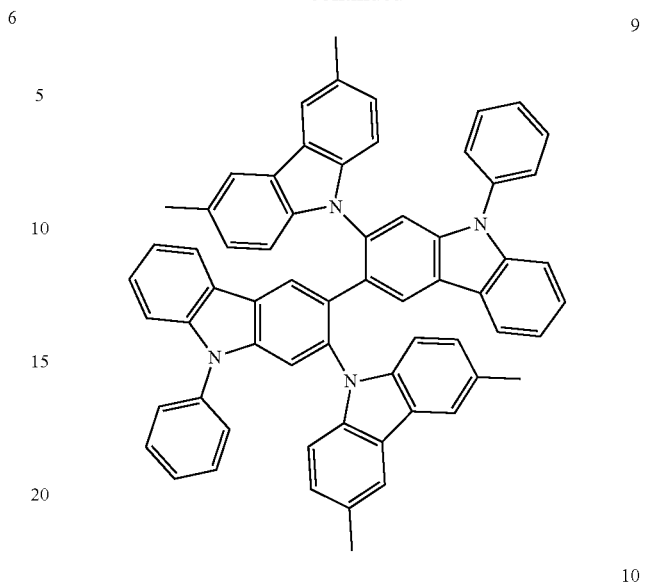
9
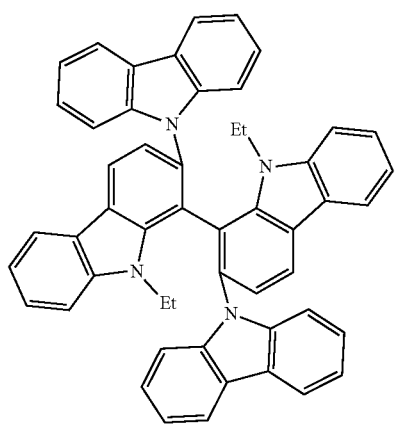
7
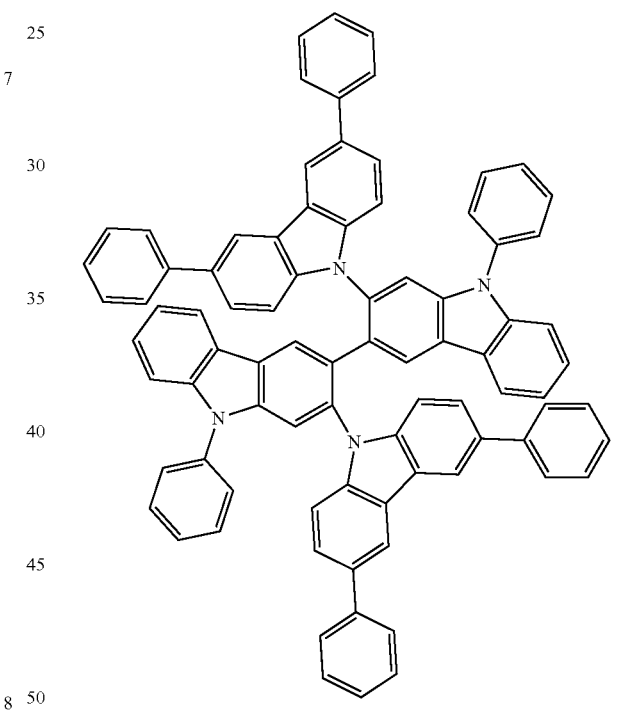
10
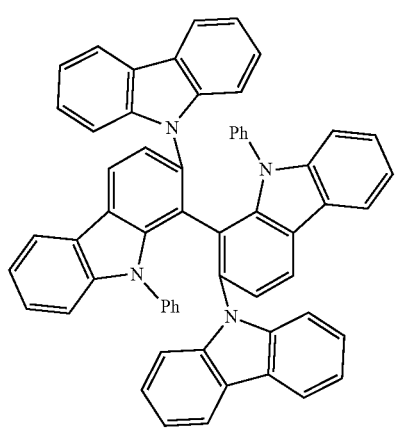
8
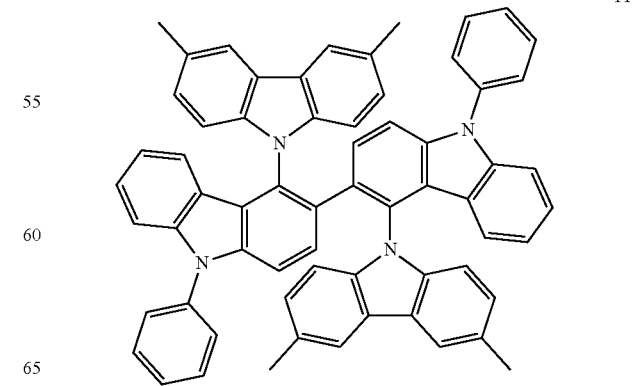
11

12
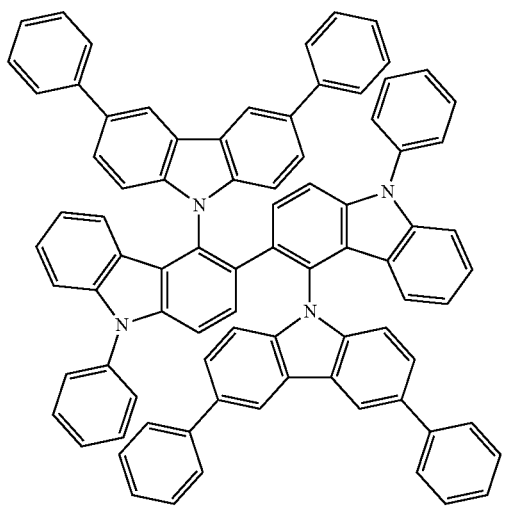
13
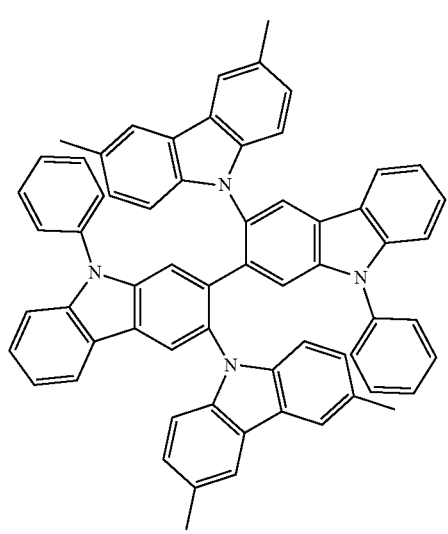
14
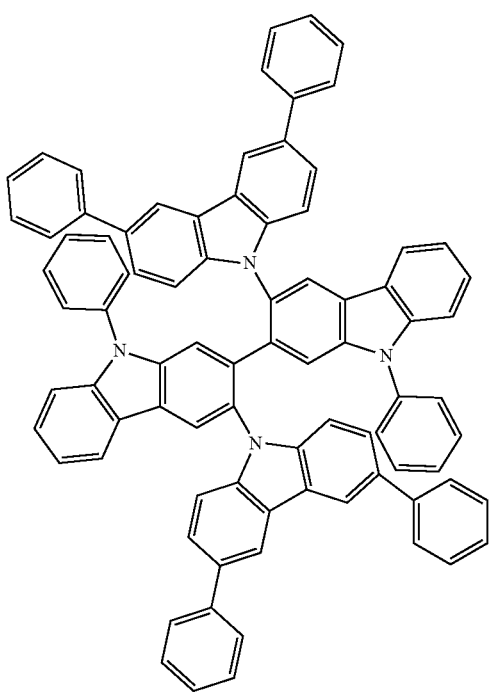
15
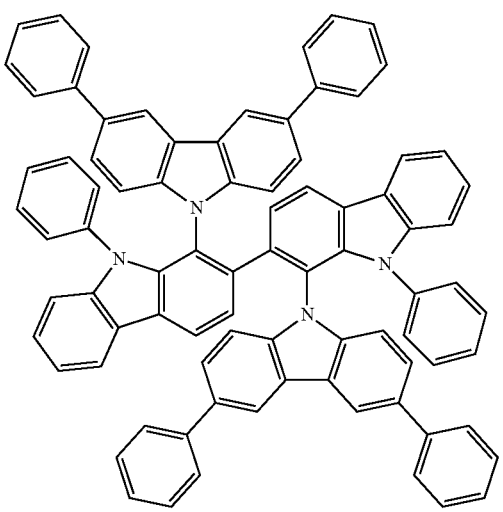

17

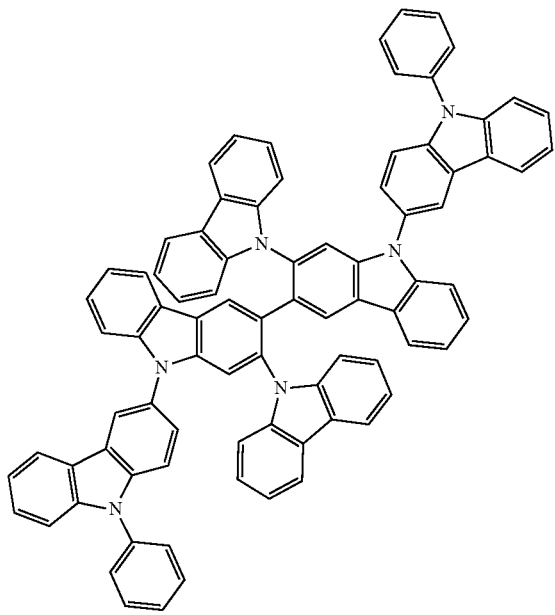

18

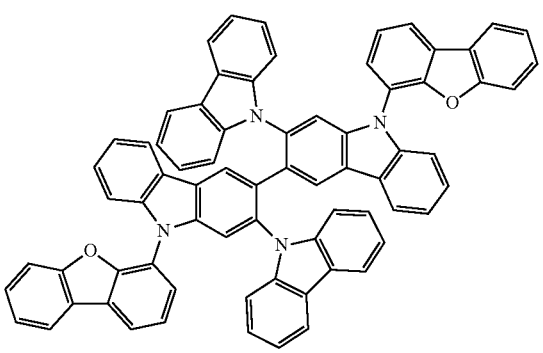

19

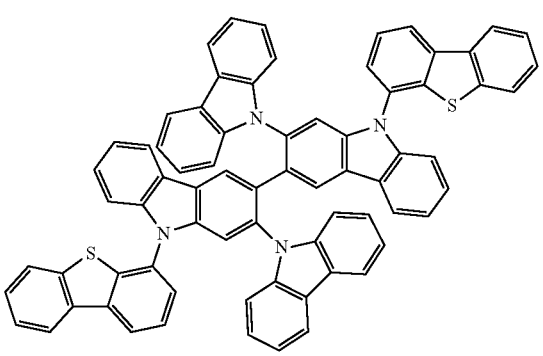

20

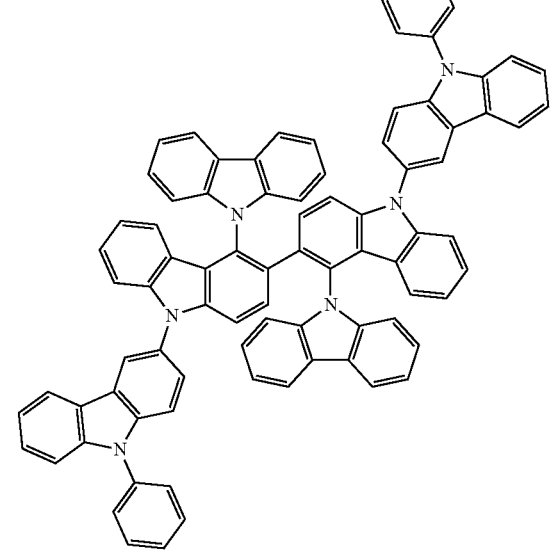

21

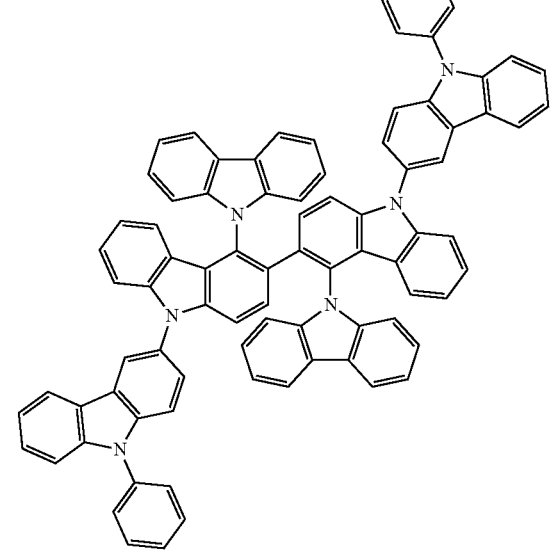

22

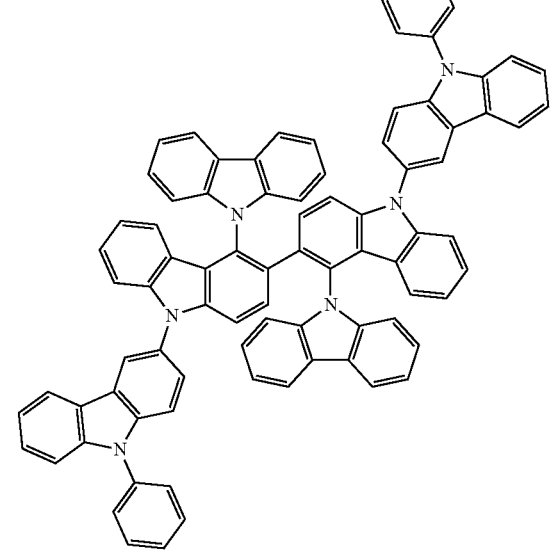

In Compound Group 1, Me is a methyl group, Et is an ethyl group, and Ph is a phenyl group.

As explained in further detail below, the hole transport region HTR may include the polycyclic compound.

The first electrode EL1 has conductivity. The first electrode EL1 may be formed using a metal alloy or a conductive compound. The first electrode EL1 may be an anode. Also, the first electrode EL1 may be a pixel electrode. The first electrode EL1 may be a transmissive electrode, a transflective electrode, or a reflective electrode. If the first electrode EL1 is the transmissive electrode, the first electrode EL1 may include a transparent metal oxide, for example, an indium tin oxide (ITO), an indium zinc oxide (IZO), a zinc oxide (ZnO), and an indium tin zinc oxide (ITZO), etc. If the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). Alternatively, the first electrode EL1 may have a structure including a plurality of layers including a reflective layer or a transflective layer formed using the above materials, and a transmissive conductive layer formed using an ITO, an IZO, a ZnO, an ITZO, etc. For example, the first electrode EL1 may include a three-layer structure of an ITO/Ag/ITO. However, exemplary embodiments are not limited thereto. The thickness of the first electrode EL1 may be from about 1,000 Å to about 10,000 Å, for example, from about 1,000 Å to about 3,000 Å.

The hole transport region HTR is disposed on the first electrode EL1. The hole transport region HTR may include the above-described polycyclic compound. The hole transport region HTR may have a single layer formed using a single material, a single layer formed using a plurality of different materials, or a multilayer structure including a plurality of layers formed using a plurality of different materials. The hole transport region HTR may be a single layer formed using the polycyclic compound, a single layer formed using another compound other than the polycyclic compound, or a multilayer structure including the polycyclic compound alone or a mixture including thereof in at least one layer.

The hole transport region HTR may include at least one of the hole injection layer HIL, the hole transport layer HTL, a hole buffer layer, or the electron blocking layer EBL. At least one layer of the hole injection layer HIL, hole transport layer HTL, hole buffer layer, or electron blocking layer EBL may include the polycyclic compound.

As the polycyclic compound of some exemplary embodiments includes at least four carbazole groups, hole transport properties are excellent. Particularly, since the polycyclic compound of some exemplary embodiments is highly symmetric about the connecting group and the carbazole substituent is substituted at ortho position with respect to the connecting group of the core structure, even better hole transport properties may be shown. Accordingly, the organic electroluminescence device 10 of some exemplary embodiments includes the polycyclic compound in the hole transport region HTR and may achieve high efficiency and long life.

The hole transport region HTR may have a single layer structure of the hole injection layer HIL or the hole transport layer HTL, or a single layer structure formed using a hole injection material and a hole transport material. In addition, the hole transport region HTR may have a structure of a single layer formed using a plurality of different materials, or a structure stacked from the first electrode EL1 of hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer EBL, without limitation.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

The hole injection layer HIL may include, for example, a phthalocyanine compound such as copper phthalocyanine, N,N'-diphenyl-N,N'-bis-[4-(phenyl-m-tolyl-amino)-phenyl]-biphenyl-4,4'-diamine (DNTPD), 4,4',4"-tris(3-methylphenylphenylamino) triphenylamine (m-MTDATA), 4,4', 4"-tris(N,N-diphenylamino)triphenylamine (TDATA), 4,4', 4"-tris{N,-2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(1-naphthalene-1-yl)-N,N'-diphenylbenzidine (NPD or NPB), triphenylamine-containing polyetherketone (TPAPEK), 4-isopropyl-4'-methyldiphenyliodonium tetrakis(pentafluorophenyl)borate, and dipyrazino[2,3-f:2',3'-h]quinoxaline-2,3,6,7,10,11-hexacarbonitrile (HAT-CN).

The hole transport layer HTL may include, for example, carbazole compounds such as N-phenyl carbazole and polyvinyl carbazole compounds, fluorine-based compounds, N,N'-bis(3-methylphenyl)-N,N'-diphenyl-[1,1-biphenyl]-4, 4'-diamine (TPD), triphenylamine-based compounds such as 4,4',4"-tris(carbazol-9-yl)triphenylamine (TCTA), N,N'-di (naphthalene-1-yl)-N,N'-diphenyl-benzidine (NPB), 4,4'-cyclohexylidene bis[N,N-bis(4-methylphenyl)benzeneamine] (TAPC), 4,4'-bis[N,N'-(3-tolyl)amino]-3,3'-dimethylbiphenyl (HMTPD), 1,3-bis(N-carbazolyl)benzene (mCP), 9-(4-tert-butylphenyl)-3,6-bis(triphenylsilyl)-9H-carbazole (CzSi), etc.

The thickness of the hole transport region HTR may be from about 100 Å to about 10,000 Å, for example, from about 100 Å to about 5,000 Å. The thickness of the hole injection region HIL may be, for example, from about 30 Å to about 1,000 Å, and the thickness of the hole transport layer HTL may be from about 30 Å to about 1,000 Å. For example, the thickness of the electron blocking layer EBL may be from about 10 Å to about 1,000 Å. If the thicknesses of the hole transport region HTR, the hole injection layer HIL, the hole transport layer HTL and the electron blocking layer EBL satisfy the above-described ranges, satisfactory hole transport properties may be achieved without substantial increase of a driving voltage.

The hole transport region HTR may further include a charge generating material to increase conductivity in addition to the above-described materials. The charge generating material may be dispersed uniformly or non-uniformly in the hole transport region HTR. The charge generating material may be, for example, a p-dopant. The p-dopant may be one of quinone compounds, metal oxides, or cyano group-containing compounds, without limitation. For example, non-limiting examples of the p-dopant may include quinone compounds such as tetracyanoquinodimethane (TCNQ) and 2,3,5,6-tetrafluoro-7,7,8,8-tetracyanoquinodimethane (F4-TCNQ), metal oxides such as tungsten oxide and molybdenum oxide, etc., without limitation.

As described above, the hole transport region HTR may further include at least one of the hole buffer layer or the electron blocking layer EBL in addition to the hole injection layer HIL and the hole transport layer HTL. The hole buffer layer may compensate an optical resonance distance according to the wavelength of light emitted from the emission layer EML to increase light emission efficiency. Materials which may be included in the hole transport region HTR may be used as materials included in the hole buffer layer. The electron blocking layer EBL is a layer playing the role of preventing the electron injection from the electron transport region ETR to the hole transport region HTR.

The emission layer EML is disposed on the hole transport region HTR. The thickness of the emission layer EML may be, for example, about 100 Å to about 1,000 Å or about 100 Å to about 300 Å. The emission layer EML may have a single layer formed using a single material, a single layer formed using a plurality of different materials, or a multi-layer structure having a plurality of layers formed using a plurality of different materials.

In the organic electroluminescence device 10 of some exemplary embodiments, the emission layer EML may include one or more anthracene compounds, pyrene compounds, fluoranthene compounds, chrysene compounds, dihydrobenzanthracene compounds, or triphenylene compounds. Particularly, the emission layer EML may include one or more anthracene compounds or pyrene compounds.

In the organic electroluminescence devices 10 of at least some exemplary embodiments, as shown in FIG. 1 to FIG. 4, the emission layer EML may include a host and a dopant.

The emission layer EML may include commonly used materials well known in the art as the host material. For example, the emission layer EML may include as a host material, at least one of bis[2-(diphenylphosphino)phenyl] ether oxide (DPEPO), 4,4'-bis(carbazol-9-yl)biphenyl (CBP), 1,3-bis(carbazol-9-yl)benzene (mCP), 2,8-bis(diphenylphosphoryl)dibenzo[b,d]furan (PPF), 4,4',4"-tris (carbazol-9-yl) triphenylamine or 1,3,5-tris(1-phenyl-1H-benzo[d] imidazol-2-yl)benzene (TPBi). However, exemplary embodiments are not limited thereto. For example, tris(8-hydroxyquinolino)aluminum (Alq3), 4,4'-bis(N-carbazolyl)-1,1'-biphenyl (CBP), poly(N-vinylcarbazole) (PVK), 9,10-di(naphthalene-2-yl)anthracene (ADN), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), bis[2-(diphenylphosphino)phenyl]ether oxide (DPEPO), hexaphenyl cyclotriphosphazene (CP1), 1,4-bis (triphenylsilyl)benzene (UGH2), hexaphenylcyclotrisiloxane (DPSiO$_3$), octaphenylcyclotetra siloxane (DPSiO$_4$), 2,8-bis(diphenylphosphoryl)dibenzofuran (PPF), 9-(4-tert-butylphenyl)-3,6-bis(triphenylsilyl)-9H-carbazole, etc. may be used as the host material.

In an exemplary embodiment, the emission layer EML may include as known dopant materials, styryl compounds (for example, 1,4-bis[2-(3-N-ethylcarbazoryl)vinyl]benzene (BCzVB), 4-(di-p-tolylamino)-4'-[(di-p-tolylamino)styryl] stilbene (DPAVB), and N-(4-((E)-2-(6-((E)-4-(diphenylamino)styryl)naphthalen-2-yl)vinyl)phenyl)-N-phenyl-benzenamine (N-BDAVBi)), perylene and the related compounds thereof (for example, 2,5,8,11-tetra-t-butylp-erylene (TBP)), pyrene and the related compounds thereof (for example, 1,1-dipyrene, 1,4-dipyrenylbenzene, 1,4-bis (N,N-diphenylamino)pyrene), etc.

The emission layer EML may emit fluorescence, or emit phosphorescence. The emission layer EML may emit delayed fluorescence. The emission layer EML may emit first color light, second color light, and third color light. The first color light may be a blue light, the second color light may be a green light, and the third color light may be a red light. The blue light may be blue light having a central wavelength of about 410 nm to about 500 nm. The green light may be green light having a central wavelength of about 500 nm to about 570 nm. The red light may be red light having a central wavelength of about 570 nm to about 700 nm. Exemplary embodiments of the invention are not limited thereto, but if the emission layer emits red light or green light, it may emit phosphorescence, and if the emission layer emits blue light, it may emit fluorescence or delayed fluorescence.

If the emission layer EML emits delayed fluorescence, the emission layer EML may include a material for thermally activated delayed fluorescence. The material for thermally activated delayed fluorescence may be used as the host or dopant of the emission layer EML. For example, the material for thermally activated delayed fluorescence may be a donor-acceptor type material for thermally activated delayed fluorescence such as 10-phenyl-10H,10'H-spiro[acridine-9, 9'-anthracen]-10'-one, or a boron-containing type material for thermally activated delayed fluorescence such as 5,9-diphenyl-5H,9H-[1,4]benzazaborino[2,3,4-k1]phenazaborine.

The polycyclic compound may have a relatively high lowest excitation triplet energy level of about 3.00 eV to about 3.20 eV. This level is the lowest excitation triplet energy level which may be suitably applied to the hole transport layer HTL of an organic electroluminescence device which emits thermally activated delayed fluorescence. Accordingly, the polycyclic compound may be applied to the hole transport region of an organic electroluminescence device which emits blue thermally activated delayed fluorescence to achieve excellent effects.

The polycyclic compound may have a relatively deep highest occupied molecular orbital energy level of about −5.50 eV to about −5.00 eV. Accordingly, if an organic electroluminescence device has a stacked structure of first hole transport layer/second hole transport layer/emission layer EML, the polycyclic compound may be included in the second hole transport layer and may play the role of relieving a hole transport barrier from the first hole transport layer to the emission layer EML. Accordingly, holes may be more rapidly transported from the hole transport region HTR to the emission layer EML.

Accordingly, if the emission layer EML emits thermally activated delayed fluorescence and the hole transport region HTR includes the polycyclic compound, high efficiency and long life of an organic electroluminescence device 10 may be achieved.

As described above, the emission layer EML was explained to include an organic light-emitting material, but exemplary embodiments of the invention are not limited thereto. In an exemplary embodiment, the emission layer EML may include an inorganic light-emitting material. For example, the emission layer EML may include an inorganic light-emitting material such as a quantum dot and a quantum rod.

In the organic electroluminescence device 10 shown in FIGS. 1 to 4, the electron transport region ETR is disposed on the emission layer EML. The electron transport region ETR may include at least one of the hole blocking layer HBL, the electron transport layer ETL or the electron injection layer EIL. However, exemplary embodiments are not limited thereto.

The electron transport region ETR may have a single layer formed using a single material, a single layer formed using a plurality of different materials, or a multilayer structure having a plurality of layers formed using a plurality of different materials.

For example, the electron transport region ETR may have a single layer structure of the electron injection layer EIL or the electron transport layer ETL, or a single layer structure formed using an electron injection material and an electron transport material. Also, the electron transport region ETR may have a single layer structure formed using a plurality of different materials, or a structure stacked from the emission layer EML of electron transport layer ETL/electron injection layer EIL, or hole blocking layer HBL/electron transport layer ETL/electron injection layer EIL, without limitation. The thickness of the electron transport region ETR may be, for example, from about 1,000 Å to about 1,500 Å.

The electron transport region ETR may be formed using various methods such as a vacuum deposition method, a spin coating method, a cast method, a Langmuir-Blodgett (LB) method, an inkjet printing method, a laser printing method, and a laser induced thermal imaging (LITI) method.

If the electron transport region ETR includes an electron transport layer ETL, the electron transport region ETR may include an anthracene-based compound. Exemplary embodiments are not limited thereto, but the electron transport region ETR may include, for example, tris(8-hydroxyquinolinato)aluminum (Alq3), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate (Bebq2), 9,10-di(naphthalene-2-yl)anthracene (ADN), 1,3-bis[3,5-di(pyridine-3-yl)phenyl]benzene (BmPyPhB), or a mixture thereof. The thickness of the electron transport layer ETL may be from about 100 Å to about 1,000 Å and may be, for example, from about 150 Å to about 500 Å. If the thickness of the electron transport layer ETL satisfies the above-described range, satisfactory electron transport properties may be obtained without substantial increase of a driving voltage.

If the electron transport region ETR includes the electron injection layer EIL, the electron transport region ETR may use a metal halide such as LiF, NaCl, CsF, RbCl and RbI, a lanthanide metal such as Yb, a metal oxide such as $Li_2O$ and BaO, or lithium quinolate (LiQ). However, exemplary embodiments are not limited thereto. The electron injection layer EIL may also be formed using a mixture material of an electron transport material and an insulating organo metal salt. The organo metal salt may be a material having an energy band gap of about 4 eV or more. Particularly, the organo metal salt may include, for example, one or more metal acetates, metal benzoates, metal acetoacetates, metal acetylacetonates, or metal stearates. The thickness of the electron injection layer EIL may be from about 1 Å to about 100 Å, and from about 3 Å to about 90 Å. If the thickness of the electron injection layer EIL satisfies the above described range, satisfactory electron injection properties may be obtained without inducing substantial increase of a driving voltage.

The electron transport region ETR may include a hole blocking layer HBL as described above. The hole blocking layer HBL may include, for example, at least one of 2,9-dimethyl-4,7-diphenyl-1,10-phenanthroline (BCP), or 4,7-diphenyl-1,10-phenanthroline (Bphen). However, exemplary embodiments are not limited thereto.

The second electrode EL2 is disposed on the electron transport region ETR. The second electrode EL2 may be a common electrode or a cathode. The second electrode EL2 may be a transmissive electrode, a transflective electrode or a reflective electrode. If the second electrode EL2 is the transmissive electrode, the second electrode EL2 may be formed using a transparent metal oxide, for example, an ITO, an IZO, an ZnO, an ITZO, etc.

If the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). Alternatively, the second electrode EL2 may have a multilayered structure including a reflective layer or a transflective layer formed using the above-described materials and a transparent conductive layer formed using an ITO, an IZO, a ZnO, an ITZO, etc.

The second electrode EL2 may be connected with an auxiliary electrode. If the second electrode EL2 is connected with the auxiliary electrode, the resistance of the second electrode EL2 may decrease.

A capping layer (CPL) may be further disposed on the second electrode EL2 of the organic electroluminescence device 10 in some exemplary embodiments. The capping layer CPL may include, for example, 2,2'-dimethyl-N,N'-di-[(1-naphthyl)-N,N'-diphenyl]-1,1'-biphenyl-4,4'-diamine (α-NPD), NPB, TPD, m-MTDATA, Alq3, copper(II) phthalocyanine (CuPc), N4,N4,N4',N4'-tetra(biphenyl-4-yl)biphenyl-4,4'-diamine (TPD15), 4,4',4''-tris(carbazol-9-yl)triphenylamine (TCTA), N,N'-bis(naphthalen–1-yl), etc.

The above-described compound may be included in a organic layer other than the hole transport region HTR as a material for the organic electroluminescence device 10. The organic electroluminescence device 10 may include the above-described compound in at least one organic layer disposed between the first electrode EL1 and the second electrode EL2, or in the capping layer CPL disposed on the second electrode EL2.

In the organic electroluminescence device 10, according to the application of voltages to the first electrode EL1 and the second electrode EL2, respectively, holes injected from the first electrode EL1 move through the hole transport region HTR to the emission layer EML, and electrons injected from the second electrode EL2 move through the electron transport region ETR to the emission layer EML. Electrons and holes are recombined in the emission layer EML to produce excitons, and light is emitted by the transition of the excitons from an excited state to a ground state.

Hereinafter, the polycyclic compound according to an exemplary embodiment and the organic electroluminescence device will be particularly explained referring to exemplary embodiments and comparative embodiments. The following exemplary embodiments are only illustrations to assist the understanding of inventive concepts, the, which are not limited thereto.

1. SYNTHETIC EXAMPLES

The polycyclic compound may be synthesized, for example, as follows. However, exemplary embodiments of the synthetic method of making the polycyclic compound are not limited thereto.

1-1. Synthesis of Compound 1

Polycyclic Compound 1 may be synthesized, for example, by the following Reaction 1:

[Reaction 1]

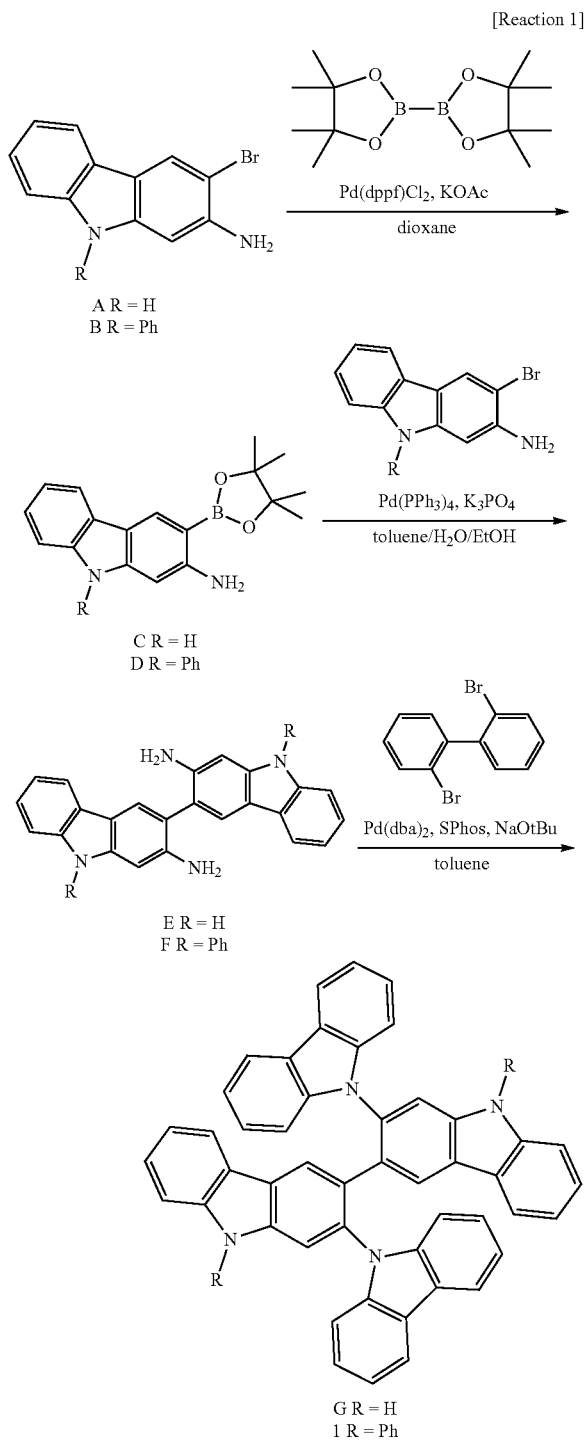

Synthesis of Intermediate C

Under an argon atmosphere, to a 1,000 ml three-neck flask, Reactant A (25.0 g), bis(pinacolato)diboron (29.2 g), a [1,1'-bis(diphenylphosphino)ferrocene]dichloropalladium(II) dichloromethane adduct (Pd(dppf)Cl$_2$, 7.85 g), and potassium acetate (KOAc, 28.1 g) were placed and dissolved in dioxane (300 ml), followed by heating and stirring at about 90° C. for about 6 hours. Water was added to the reaction product, and the resultant mixture was extracted with CH$_2$Cl$_2$. Organic layers were collected and dried with MgSO$_4$, and solvents were removed by distilling under a reduced pressure. The crude product thus obtained was separated by silica gel column chromatography to obtain 19.2 g (yield 65%) of Intermediate C. The molecular weight of Intermediate C, measured by fast atom bombardment-mass spectrometry (FAB-MS) was 308.

Synthesis of Intermediate D

Intermediate D was obtained in 20.5 g (yield 72%) from Reactant B (25.0 g) by performing the same method as the above-described synthetic method of Intermediate C. The molecular weight of Intermediate D, measured by (FAB-MS) was 384.

Synthesis of Intermediate E

Under an argon atmosphere, to a 1,000 ml three-neck flask, Intermediate C (15.0 g), Reactant A (12.7 g), tetrakis(triphenylphosphine)palladium(0) (Pd(PPh$_3$)$_4$, 5.62 g), and tripotassium phosphate (K$_3$PO$_4$, 20.7 g) were placed and dissolved in a mixture solvent of toluene, water and ethanol (10:2:1, 200 ml), followed by heating and stirring at about 80° C. for about 12 hours. Water was added to the reaction product, and the resultant mixture was extracted with CH$_2$Cl$_2$. Organic layers were collected and dried with MgSO$_4$, and solvents were removed by distilling under a reduced pressure. The crude product thus obtained was separated by silica gel column chromatography to obtain 10.9 g (yield 62%) of Intermediate E. The molecular weight of Intermediate E, measured by FAB-MS was 362.

Synthesis of Intermediate F

Intermediate F was obtained in 8.04 g (yield 60%) by reacting Intermediate D (10.0 g) and Intermediate B (8.77 g) by performing the same method as the above-described synthetic method of Intermediate E. The molecular weight of Intermediate F, measured by FAB-MS was 514.

Synthesis of Intermediate G

Under an argon atmosphere, to a 1,000 ml three-neck flask, Intermediate E (8.00 g), 2,2'-dibromo-1,1'-biphenyl (13.8 g), bis(dibenzylideneacetone)palladium(0) (Pd(dba)$_2$, 1.27 g), 2-dicyclohexylphosphino-2',6'-dimethoxybiphenyl (SPhos, 1.81 g), and sodium tert-butoxide (NaOtBu, 12.7 g) were placed and dissolved in toluene (200 ml), followed by heating and refluxing for about 12 hours. Then, water was added to the reaction product, and the resultant mixture was extracted with CH$_2$Cl$_2$. Organic layers were collected and dried with MgSO$_4$, and solvents were removed by distilling under a reduced pressure. The crude product thus obtained was separated by silica gel column chromatography to obtain 6.58 g (yield 45%) of Intermediate G. The molecular weight of Intermediate G, measured by FAB-MS was 662.

Synthesis of Compound 1

Compound 1 was obtained in 3.33 g (yield 42%) by reacting Intermediate F (5.00 g) and 2,2'-dibromo-1,1'-biphenyl (6.06 g) by performing the same method as the above-described synthetic method of Intermediate G. The molecular weight of Compound 1, measured by FAB-MS was 814.

1-2. Synthesis of Compound 2

Polycyclic Compound 2 may be synthesized, for example, by the following Reaction 2:

[Reaction 2]

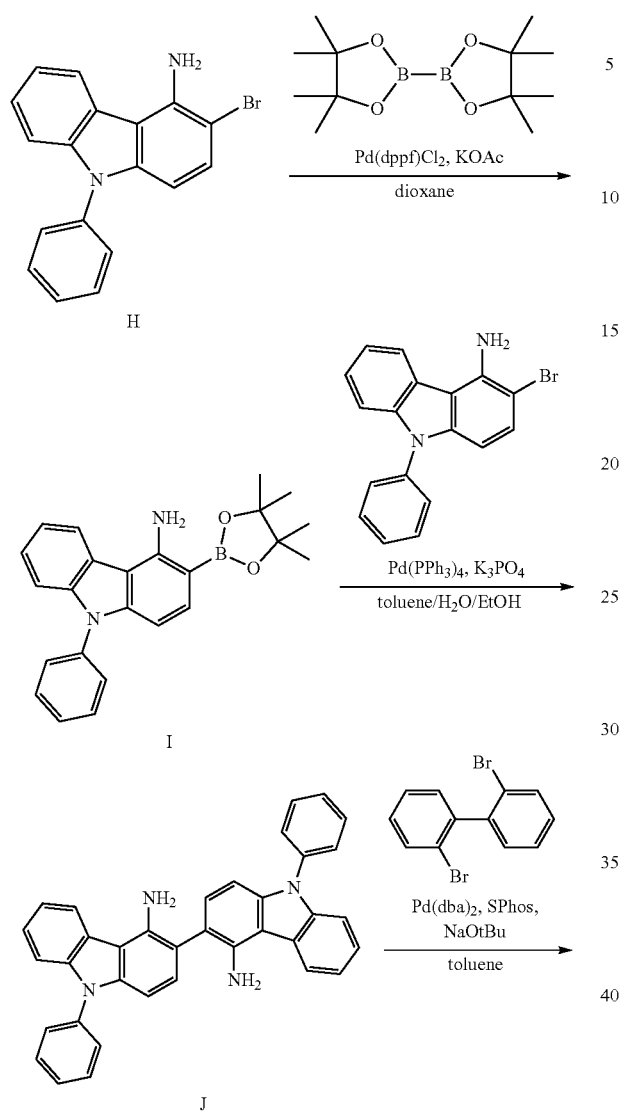

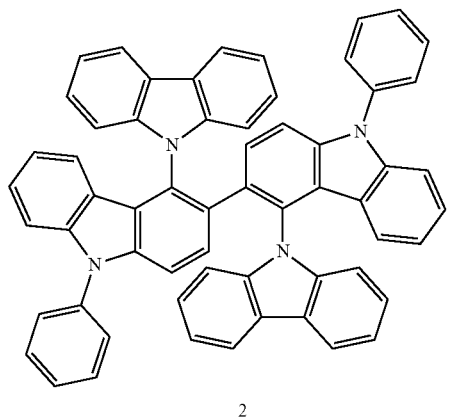

Synthesis of Intermediate I

Intermediate I was obtained in 15.6 g (yield 55%) by reacting Reactant H (25.0 g) by performing the same method as the above-described synthetic method of Intermediate C. The molecular weight of Intermediate I, measured by FAB-MS was 384.

Synthesis of Intermediate J

Intermediate J was obtained in 10.7 g (yield 40%) by reacting Intermediate I (20.0 g) and Reactant H (17.6 g) by performing the same method as the above-described synthetic method of Intermediate E. The molecular weight of Intermediate J, measured by FAB-MS was 514.

Synthesis of Compound 2

Compound 2 was obtained in 5.38 g (yield 34%) by reacting Intermediate J (10.0 g) and 2,2'-dibromo-1,1'-biphenyl (12.2 g) by performing the same method as the above-described synthetic method of Intermediate G. The molecular weight of Compound 2, measured by FAB-MS was 814.

1-3. Synthesis of Compound 18 and Compound 19

Polycyclic Compounds 18 and 19 of exemplary embodiments may be synthesized, for example, by the following Reaction 3:

[Reaction 3]

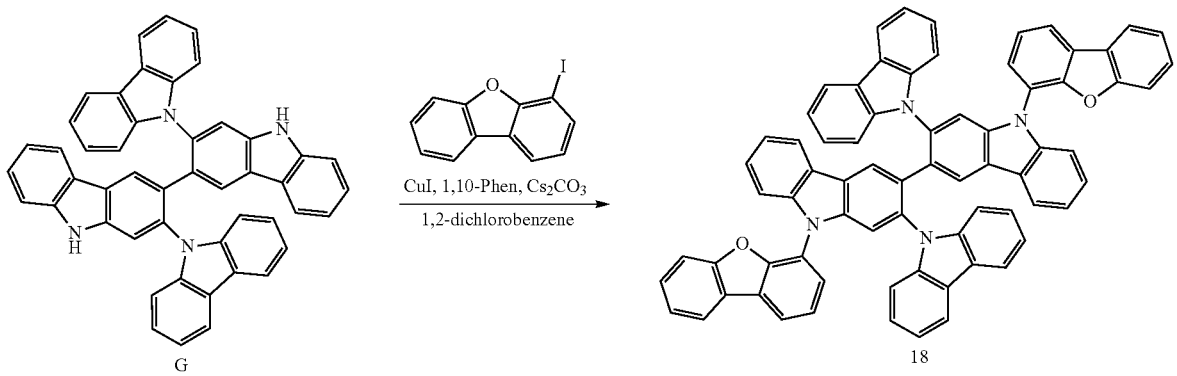

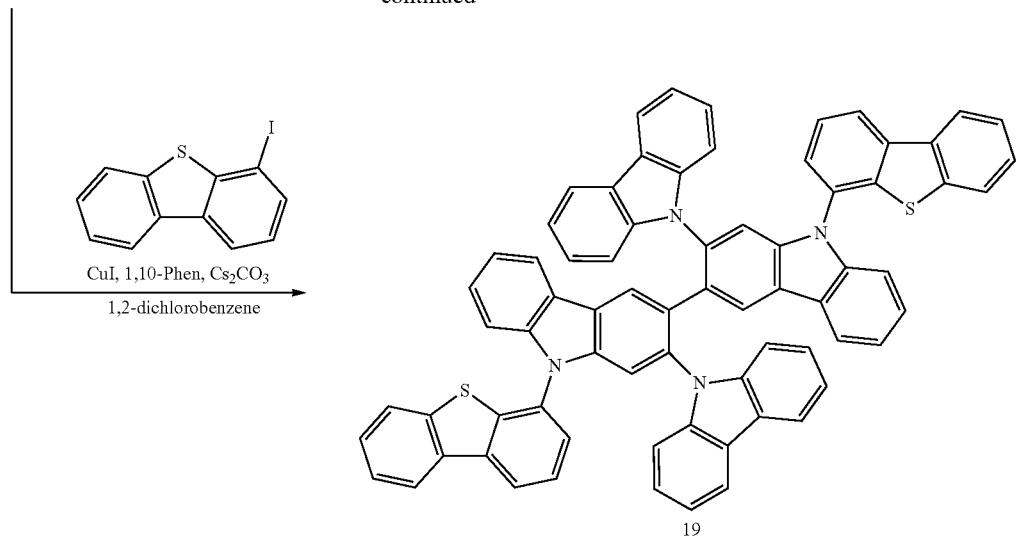

19

Synthesis of Compound 18

Under an argon atmosphere, to a 200 ml three-neck flask, Intermediate G (5.00 g), 4-iododibenzofuran (4.44 g), copper(I) iodide (CuI, 0.14 g), 1,10-phenanthroline (1,10-Phen, 0.27 g), and cesium carbonate ($Cs_2CO_3$, 12.3 g) were placed and dissolved in 1,2-dichlorobenzene (50 ml), followed by heating and stirring at about 190° C. for about 8 hours. Water was added to the reaction product, and the resultant mixture was extracted with $CH_2Cl_2$. Organic layers were collected and dried with $MgSO_4$, and solvents were removed by distilling under a reduced pressure. The crude product thus obtained was separated by silica gel column chromatography to obtain 1.88 g (yield 25%) of Compound 18. The molecular weight of Compound 18, measured by FAB-MS was 995.

Synthesis of Compound 19

Compound 19 was obtained in 1.55 g (yield 20%) by reacting Intermediate G (5.00 g) and 4-iododibenzothiophene (4.68 g) by performing the same method as the above-described synthetic method of Compound 18. The molecular weight of Compound 19, measured by FAB-MS was 1,027.

2. MANUFACTURE AND EVALUATION OF ORGANIC ELECTROLUMINESCENCE DEVICE INCLUDING POLYCYCLIC COMPOUND

2-1. Examples of Organic Electroluminescence Devices Including Polycyclic Compound The highest occupied molecular orbital energy level (hereinafter, HOMO energy level), the lowest unoccupied molecular orbital energy level (hereinafter, LUMO energy level), the lowest excitation singlet energy level (hereinafter, $S_1$ energy level), and the lowest excitation triplet energy level (hereinafter, $T_1$ energy level) of Example Compounds 1, 2, 18 and 19, Comparative Compounds X-1 and X-2, mCP, NPD and 3,3'-di(9H-carbazol-9-yl)-1,1'-biphenyl (mCBP) were measured.

Organic electroluminescence devices of Examples 1 to 4 and Comparative Examples 1 and 2, which emit fluorescence using Example Compounds 1, 2, 18 and 19 and Comparative Compounds X-1 and X-2 as materials for a hole transport layer, and organic electroluminescence devices of Examples 5 to 8 and Comparative Examples 3 to 5, which emit thermally activated delayed fluorescence, were manufactured.

Example Compounds

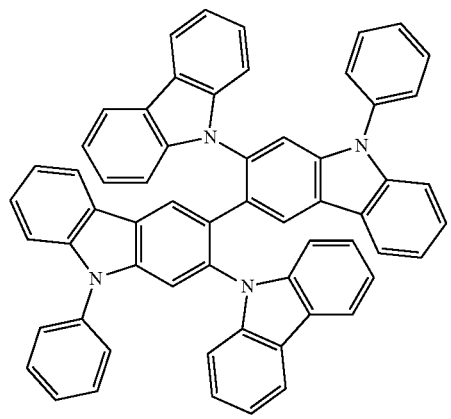

1

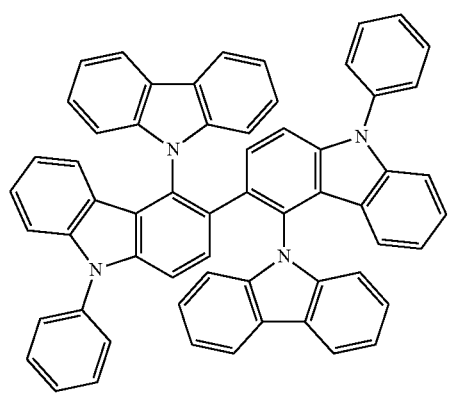

2

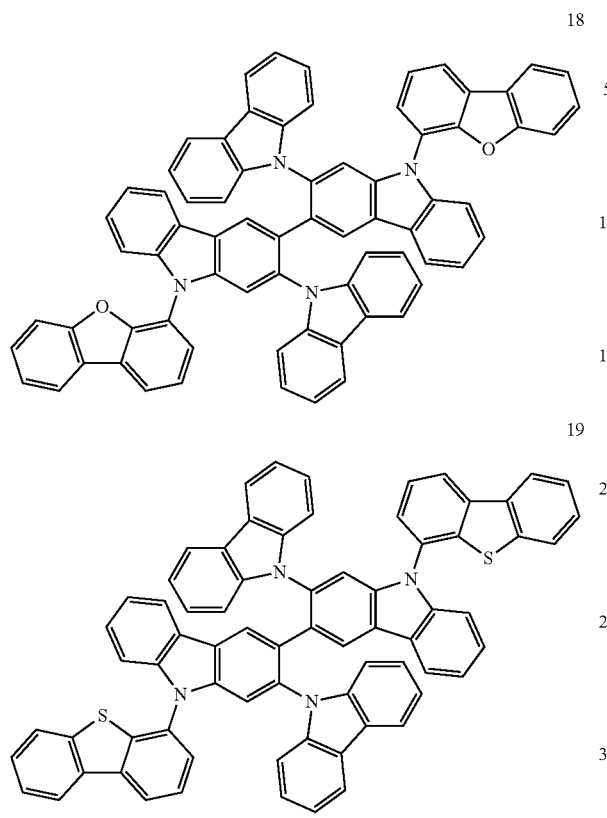

18

19

Comparative Compounds

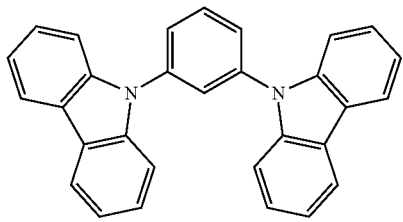

mCP

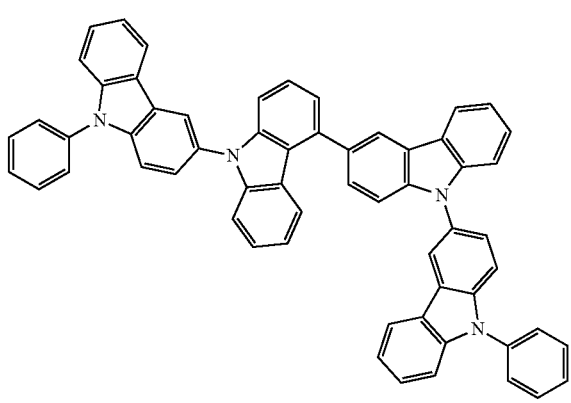

X-1

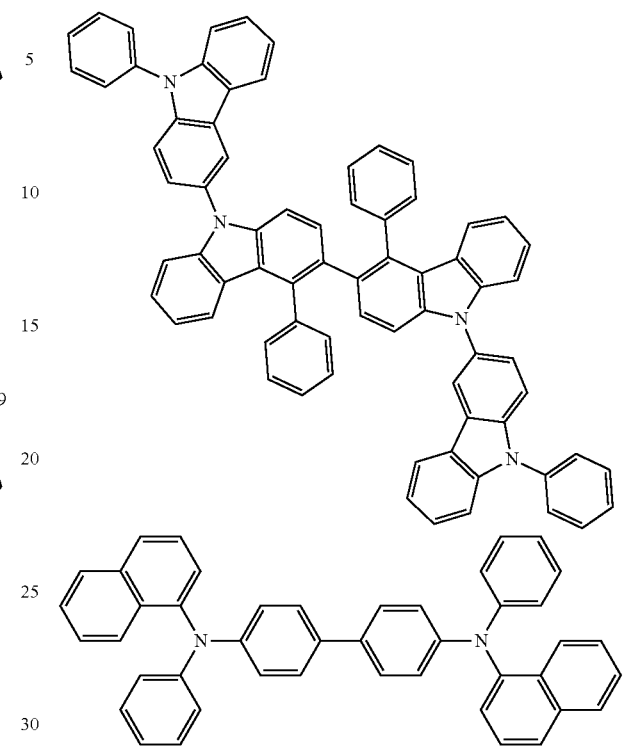

X-2

NPD mCBP

Evaluation of HOMO, LUMO, $S_1$ and $T_1$ energy levels

The calculation of the HOMO, LUMO, $S_1$ and $T_1$ energy levels were conducted by a non-empirical molecular orbital method. Particularly, the calculation was conducted using a Gaussian09 product of Gaussian Co., of Wallingford, CT and using B3LYP as a functional and 6-31G(d) as a basis function.

TABLE 1

| Compound | HOMO (eV) | LUMO (eV) | S1 (eV) | T1 (eV) |
| --- | --- | --- | --- | --- |
| Example Compound 1 | −5.07 | −0.99 | 3.54 | 3.01 |
| Example Compound 2 | −5.19 | −0.90 | 3.70 | 3.04 |
| Example Compound 18 | −5.05 | −1.20 | 3.13 | 3.02 |
| Example Compound 19 | −5.04 | −1.21 | 3.12 | 3.02 |
| Comparative Compound X-1 | −4.91 | −0.92 | 3.19 | 3.02 |

TABLE 1-continued

| Compound | HOMO (eV) | LUMO (eV) | S1 (eV) | T1 (eV) |
|---|---|---|---|---|
| Comparative Compound X-2 | −4.83 | −0.89 | 3.18 | 3.08 |
| mCP | −5.45 | −0.75 | 3.38 | 3.18 |
| NPD | −4.73 | −1.15 | 3.07 | 2.47 |
| mCBP | −5.41 | −1.20 | 3.37 | 3.15 |

Manufacture of Organic Electroluminescence Device

In order to manufacture each of the organic electroluminescence devices of Examples 1 to 4 and Comparative Examples 1 and 2, a first electrode EL1 with a thickness of about 150 nm was formed using ITO. A hole injection layer HIL with a thickness of about 60 nm was formed using 2-TNATA, and a hole transport layer HTL with a thickness of about 30 nm was formed using the Example Compound or the Comparative Compound. An emission layer EML with a thickness of about 25 nm was formed using ADN doped with 3% TBP. An electron transport layer ETL with a thickness of about 25 nm was formed using $Alq_3$, and an electron injection layer EIL with a thickness of about 1 nm was formed using LiF. A second electrode EL2 with a thickness of about 100 nm was formed using Al. Each layer was formed by a vacuum deposition method. 2-TNATA, TBP, ADN, and $Alq_3$ were used after sublimating and purifying commercial products.

In order to manufacture each of the organic electroluminescence devices of Examples 5 to 8 and Comparative Examples 3 to 5, a first electrode EL1 with a thickness of about 150 nm was formed using ITO. A hole injection layer HIL with a thickness of about 10 nm was formed using HAT-CN, a first hole transport layer with a thickness of about 80 nm was formed using NPD, and a second hole transport layer with a thickness of about 5 nm was formed using the Example Compound or the Comparative Compound. An emission layer EML with a thickness of about 25 nm was formed using mCBP doped with 3% 10-phenyl-10H,10'H-spiro-[acridine-9,9'-anthracen]-10'-one (ACRSA). An electron transport layer ETL with a thickness of about 25 nm was formed using $Alq_3$, and an electron injection layer EIL with a thickness of about 1 nm was formed using LiF. A second electrode EL2 with a thickness of about 100 nm was formed using Al. Each layer was formed by a vacuum deposition method. The compounds HAT-CN, NPD, mCP, mCBP, ACRSA, and TPBi were used after sublimating and purifying commercial products.

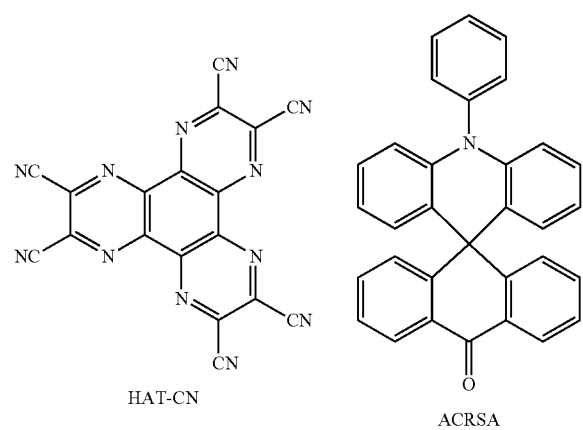

HAT-CN

ACRSA

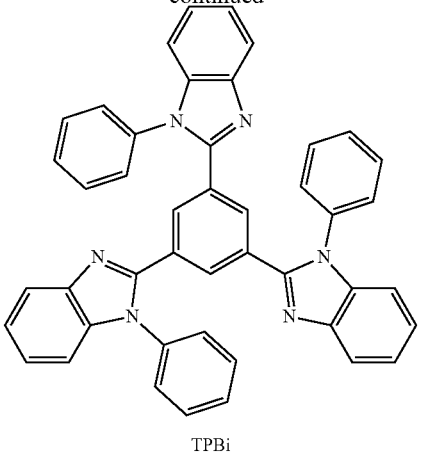

TPBi

Evaluation of Properties of Organic Electroluminescence Devices

In order to evaluate the light-emitting properties of the organic electroluminescence devices thus manufactured, a luminous brightness measurement apparatus, C9920-11, of HAMAMATSU Photonics Co. was used. In order to evaluate the properties of the organic electroluminescence devices according to the Examples and the Comparative Examples, emission efficiency, and luminance half life were measured. The emission efficiency is a value on a current density of about 10 mA/cm². The luminance half life was shown based on a time period taken for the decrease from a luminance of about 1,200 cd/m² to a 50% degree thereof. The current density of luminance half life was measured by continuously driving at about 1.0 mA/cm².

The light-emitting device used in Examples 1 to 4, and Comparative Examples 1 and 2 are organic electroluminescence devices emitting blue light as fluorescence. The evaluation results of Table 1 were shown based on the emission efficiency and luminance half life (100%) of Comparative Example 1 which used Comparative Compound X-1 as a material for a hole transport layer.

The light-emitting devices used in Examples 5 to 8, and Comparative Examples 3 to 5 are organic electroluminescence devices emitting blue light as thermally activated delayed fluorescence. The evaluation results of Table 2 are shown based on the emission efficiency and luminance half life (100%) of Comparative Example 5 which used Comparative Compound mCP as a material for a hole transport layer.

TABLE 2

| Device manufacturing example | Hole transport layer material | Emission efficiency | Luminance half life |
|---|---|---|---|
| Example 1 | Example Compound 1 | 109% | 109% |
| Example 2 | Example Compound 2 | 111% | 109% |
| Example 3 | Example Compound 18 | 115% | 115% |
| Example 4 | Example Compound 19 | 113% | 118% |
| Comparative Example 1 | Comparative Compound X-1 | 100% | 100% |
| Comparative Example 2 | Comparative Compound X-2 | 102% | 95% |

TABLE 3

| Device manufacturing example | Hole transport layer material | Emission efficiency | Luminance half life |
|---|---|---|---|
| Example 5 | Example Compound 1 | 158% | 178% |
| Example 6 | Example Compound 2 | 141% | 175% |
| Example 7 | Example Compound 18 | 147% | 192% |
| Example 8 | Example Compound 19 | 147% | 200% |
| Comparative Example 3 | Comparative Compound X-1 | 115% | 120% |
| Comparative Example 4 | Comparative Compound X-2 | 110% | 130% |
| Comparative Example 5 | mCP | 100% | 100% |

Referring to the results of Table 2, in case of applying the polycyclic compound according to an exemplary embodiment of the invention in an organic electroluminescence device as a material for a hole transport layer, high efficiency and long life may be achieved. Particularly, Example 1 to Example 4 were confirmed to achieve higher efficiency and longer life when compared with Comparative Example 1 and Comparative Example 2.

Comparative Compound X-1 includes four carbazole groups but does not have a symmetrical structure. Accordingly, due to such steric difference, the Example Compounds having a symmetrical structure were found to have high hole transport properties. Therefore, Examples 1 to 4 were found to achieve higher efficiency and longer life than Comparative Example 1.

Comparative Compound X-2 includes four carbazole groups and has symmetry. However, different from the Example Compounds in which a carbazole group is substituted at an ortho position with respect to the connecting group of a bicarbazole core structure, a phenyl group is substituted in Comparative Compound X-2. Accordingly, due to such steric difference, the Example Compounds having a symmetrical structure were found to have high hole transport properties. Therefore, Examples 1 to 4 were found to achieve higher efficiency and longer life than Comparative Example 2.

Referring to the results of Table 3, in case of applying the polycyclic compound according to an exemplary embodiment of the invention in an organic electroluminescence device as a material for a hole transport layer, high efficiency and long life may be achieved. Particularly, Example 5 to Example 8 were confirmed to achieve higher efficiency and longer life when compared with Comparative Example 3 to Comparative Example 5.

The Example Compounds have a similar T1 energy level when compared with mCBP which may be used as a material of a hole transport layer HTL of an organic electroluminescence device 10 which emits thermally activated delayed fluorescence. Accordingly, it is considered that the diffusion of energy emitted by excitons formed in the emission layer to a layer other than the emission layer is prevented. In addition, effects due to the steric structure of the Example Compounds were added, and the device efficiency and life were considered to increase.

In a case where a material having a HOMO energy level of about −5.0 eV to about −4.7 eV like NPD is used as a first hole transport layer, and a material having a HOMO energy level of about −5.5 eV to about −5.0 eV like the compound of an exemplary embodiment as a material for a second hole transport layer between the first hole transport layer and the emission layer EML, energy barrier during transporting holes from the first hole transport layer to the emission layer EML may be achieved. Accordingly, it is considered that the high efficiency and long life of a device may also be achieved.

The organic electroluminescence device of at least some exemplary embodiments includes a polycyclic compound including a core structure including a n,n'-bicarbazole moiety, and a substituted or unsubstituted carbazole group which is substituted at the core structure. The substituted or unsubstituted carbazole groups are substituted at any one among carbon atoms at position n±1 and carbon atoms at position n'±1 of the n,n'-bicarbazole moiety, respectively. Accordingly, the organic electroluminescence device may achieve high efficiency and long life. The above-described polycyclic compound may be applied to an organic electroluminescence device to achieve high efficiency and long life.

Organic electroluminescence devices including polycyclic compounds made according to the principles and exemplary implementations of the invention achieve high efficiency and long life.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An organic electroluminescence device, comprising:
a first electrode;
a second electrode disposed on the first electrode; and
at least one organic layer disposed between the first electrode and the second electrode;
wherein
the at least one organic layer comprises a polycyclic compound having a core structure including a n,n'-bicarbazole moiety and at least one substituted or unsubstituted carbazole group, and
the substituted or unsubstituted carbazole groups are substituted at any one among carbon atoms at position n±1 of the n,n'-bicarbazole moiety, and any one among carbon atoms at position n'±1 of the n,n'-bicarbazole moiety, respectively; and
n and n' are, independently from one another, integers of 1, 2, or 4, wherein n+1 and n'+1 are not 0.

2. The organic electroluminescence device of claim 1, wherein n and n' are the same; and
the substituted or unsubstituted carbazole groups are substituted at a carbon atom at position n+1 of the n,n'-bicarbazole moiety and a carbon atom at position n'+1 of the n,n'-bicarbazole moiety, respectively, or at a carbon atom at position n−1 of the n,n'-bicarbazole moiety and a carbon atom at position n'−1 of the n,n'-bicarbazole moiety, respectively.

3. The organic electroluminescence device of claim 1, wherein the polycyclic compound has a symmetrical structure about a connecting group of the n,n'-bicarbazole moiety; and
the connecting group is a group connecting two carbazole groups at carbon at position n and carbon at position n' of the n,n'-bicarbazole moiety via a direct bond.

4. The organic electroluminescence device of claim 1, wherein nitrogen at position 9 of the at least one substituted or unsubstituted carbazole group is bonded to the n,n'-bicarbazole moiety.

5. The organic electroluminescence device of claim 1, wherein an energy level of a highest occupied molecular orbital of the polycyclic compound is from about −5.50 eV to about −5.00 eV.

6. The organic electroluminescence device of claim 1, wherein a lowest excitation triplet energy level of the polycyclic compound is about 3.00 eV to about 3.20 eV.

7. The organic electroluminescence device of claim 1, wherein the at least one organic layer comprises:
   a hole transport region comprising the polycyclic compound disposed on the first electrode;
   an emission layer disposed on the hole transport region; and
   an electron transport region disposed between the emission layer and the second electrode.

8. The organic electroluminescence device of claim 7, wherein the emission layer is configured to emit thermally activated delayed fluorescence.

9. The organic electroluminescence device of claim 7, wherein the emission layer is configured to emit blue light.

10. The organic electroluminescence device of claim 1, wherein the polycyclic compound is represented by the following Formula 1:

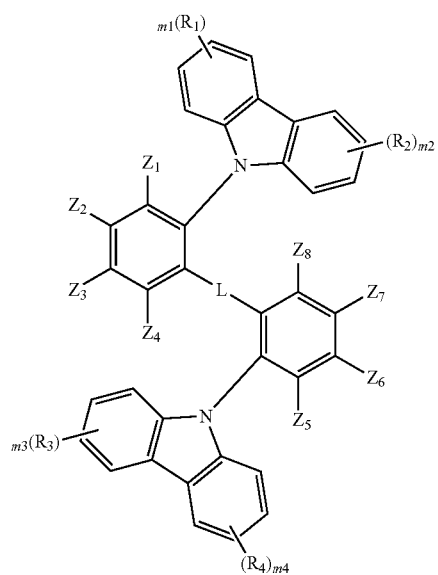

[Formula 1]

in Formula 1,
L is a direct linkage;
$R_1$ to $R_4$ are each, independently from one another, a hydrogen atom, a deuterium atom, a halogen atom, a substituted or unsubstituted amino group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, or combined with an adjacent group to form a ring;
m1 to m4 are each, independently from one another, an integer of 1 to 4;

$Z_1$ to $Z_8$ are each, independently from one another, a hydrogen atom, a deuterium atom, a halogen atom, a substituted or unsubstituted amino group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, or combined with an adjacent group to form a ring; and at least one pair among $Z_1$ and $Z_2$, $Z_2$ and $Z_3$, and $Z_3$ and $Z_4$ represented by the following Formula 2-1, and at least one pair among $Z_5$ and $Z_6$, $Z_6$ and $Z_7$, and $Z_7$ and $Z_8$ represented by the following Formula 2-2:

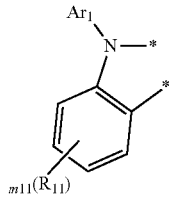

[Formula 2-1]

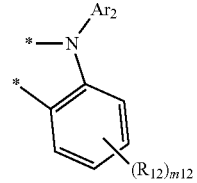

[Formula 2-2]

in Formulae 2-1 and 2-2,
$R_{11}$, and $R_{12}$ are each, independently from one another, a hydrogen atom, a deuterium atom, a halogen atom, a substituted or unsubstituted amino group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, or combined with an adjacent group to form a ring;
m11 and m12 are each, independently from one another, an integer of 1 to 4; and
$Ar_1$ and $Ar_2$ are each, independently from one another, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, wherein
when $Z_2$ and $Z_3$ are represented by the Formula 2-1 and $Z_6$ and $Z_7$ are represented by the Formula 2-2, then $Z_2$ is not represented by nitrogen of the Formula 2-1 and $Z_6$ is not represented by nitrogen of the Formula 2-2.

11. The organic electroluminescence device of claim 10, wherein Formula 1 has a symmetrical structure about L.

12. The organic electroluminescence device of claim 10, wherein a compound of Formula 1 is represented by one or more compounds of the following Formulae 1-3 to 1-6:

[Formula 1-3]

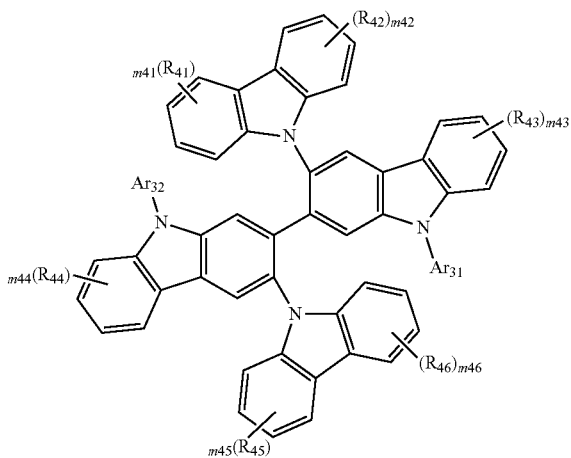

[Formula 1-4]

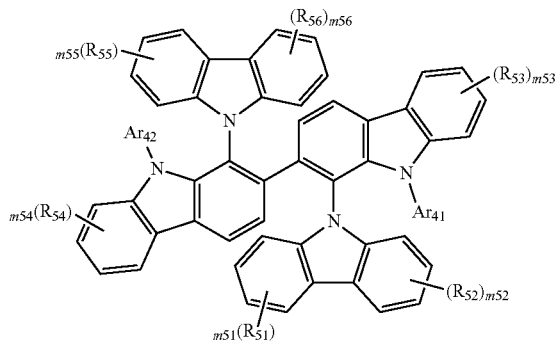

[Formula 1-5]

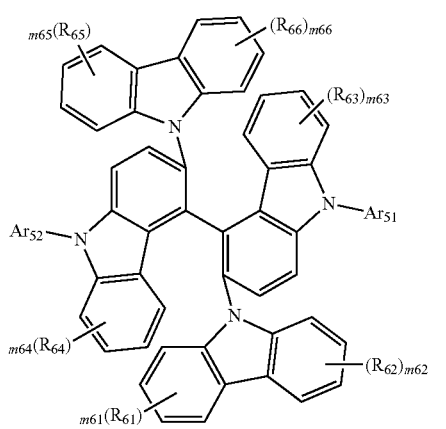

[Formula 1-6]

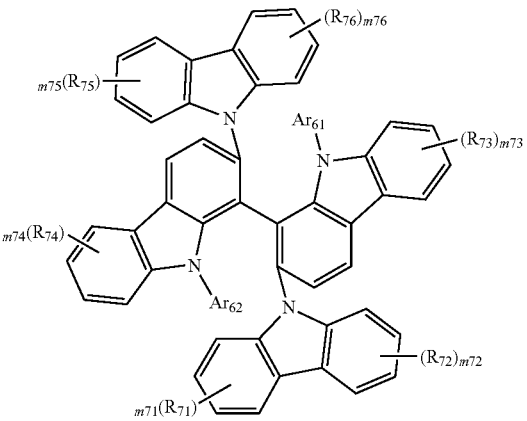

in Formulae 1-3 to 1-6, $R_{41}$ to $R_{46}$, $R_{51}$ to $R_{56}$, $R_{61}$ to $R_{66}$, and $R_{71}$ to $R_{76}$ are each, independently from one another, a hydrogen atom, a deuterium atom, a halogen atom, a substituted or unsubstituted amino group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, or combined with an adjacent group to form a ring;

m41 to m46, m51 to m56, m61 to m66, and m71 to m76 are each, independently from one another, an integer of 1 to 4; and $Ar_{31}$, $Ar_{32}$, $Ar_{41}$, $Ar_{42}$, $Ar_{51}$, $Ar_{52}$, $Ar_{61}$, and $Ar_{62}$ are each, independently from one another, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring.

13. The organic electroluminescence device of claim 10, wherein $R_1$ to $R_4$ are the same, and $Ar_1$ and $Ar_2$ are the same.

14. The organic electroluminescence device of claim 10, wherein the polycyclic compound comprises at least one compound from the following Compound Group 1:

[Compound Group 1]

3

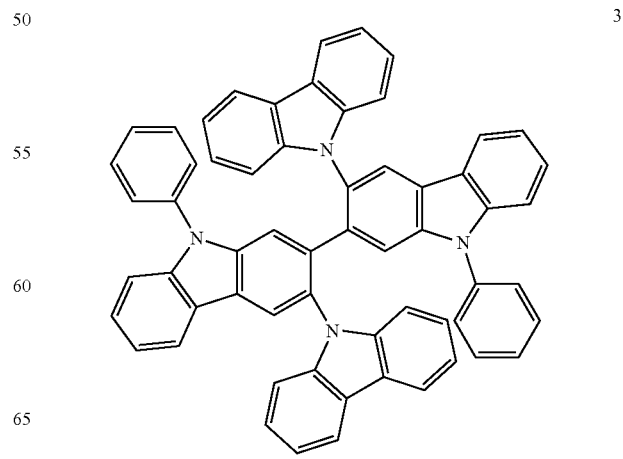

4
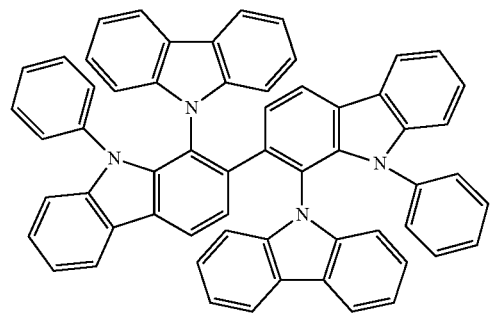
5
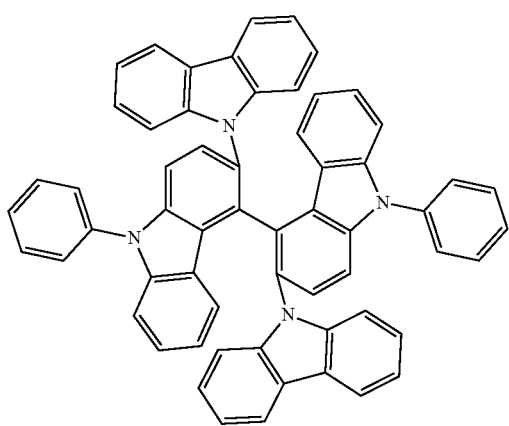
6
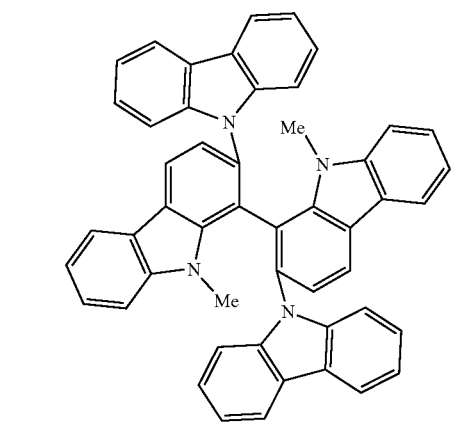
7
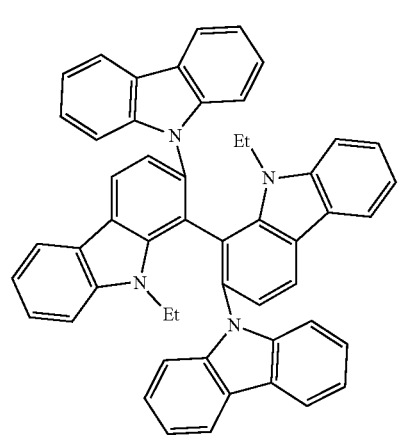
8
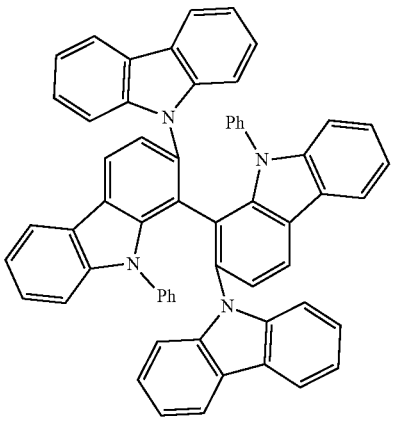
13
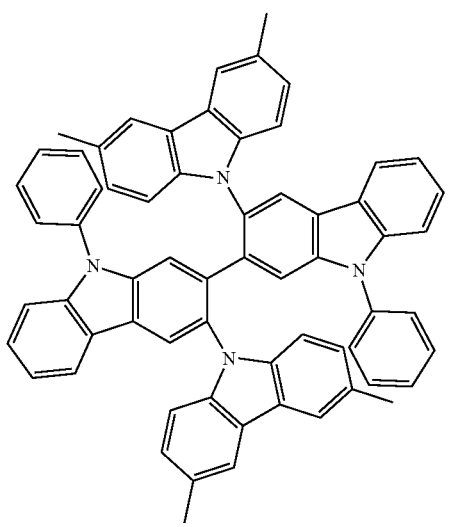
14
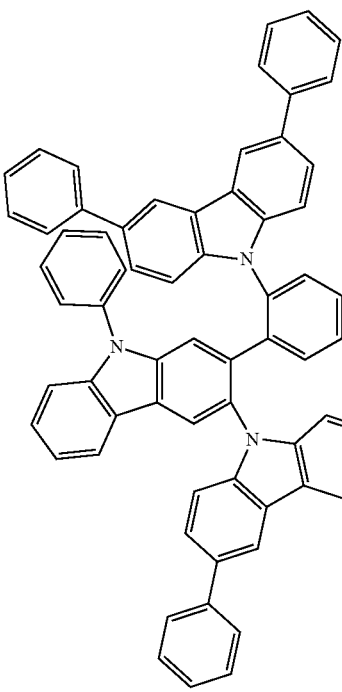

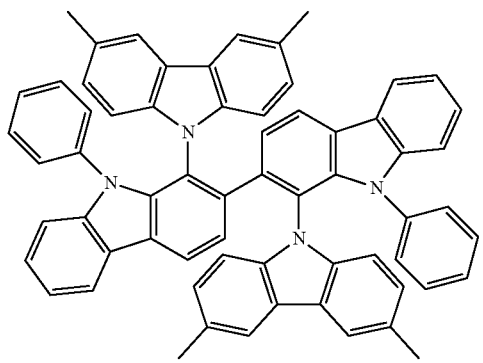

15

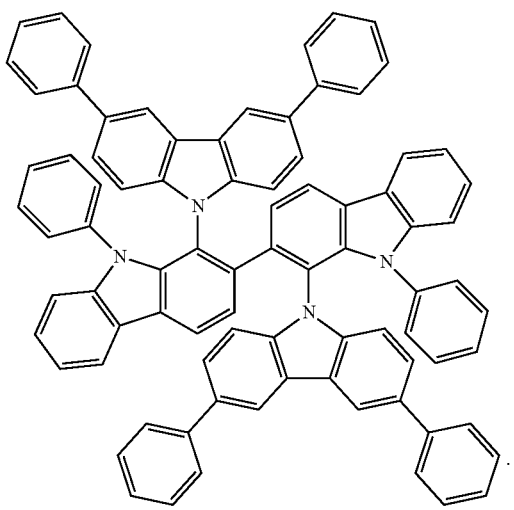

16

15. An organic electroluminescence device, comprising:
a first electrode;
a second electrode disposed on the first electrode; and
at least one organic layer disposed between the first electrode and the second electrode;
wherein the organic layer comprises a polycyclic compound represented by the following Formula 1:

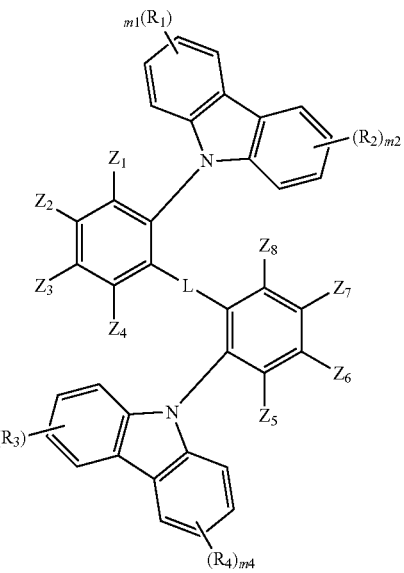

[Formula 1]

in Formula 1,

L is a direct linkage;

$R_1$ to $R_4$ are each, independently from one another, a hydrogen atom, a deuterium atom, a halogen atom, a substituted or unsubstituted amino group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, or combined with an adjacent group to form a ring;

m1 to m4 are each, independently from one another, an integer of 1 to 4;

$Z_1$ to $Z_8$ are each, independently from one another, a hydrogen atom, a deuterium atom, a halogen atom, a substituted or unsubstituted amino group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, or combined with an adjacent group to form a ring; and at least one pair among $Z_1$ and $Z_2$, $Z_2$ and $Z_3$, and $Z_3$ and $Z_4$ is represented by the following Formula 2-1, and at least one pair among $Z_5$ and $Z_6$, $Z_6$ and $Z_7$, and $Z_7$ and $Z_8$ is represented by the following Formula 2-2:

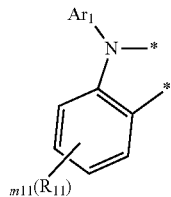

[Formula 2-1]

-continued

[Formula 2-2]

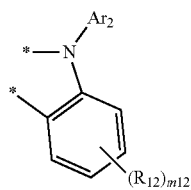

[Formula 1-4]

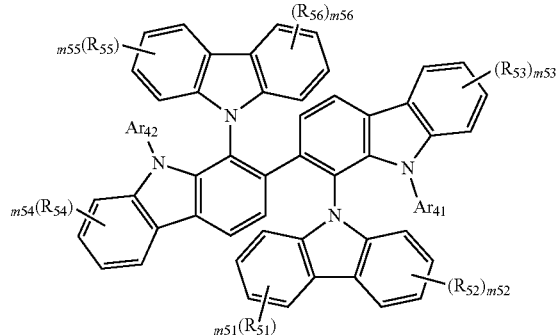

[Formula 1-5]

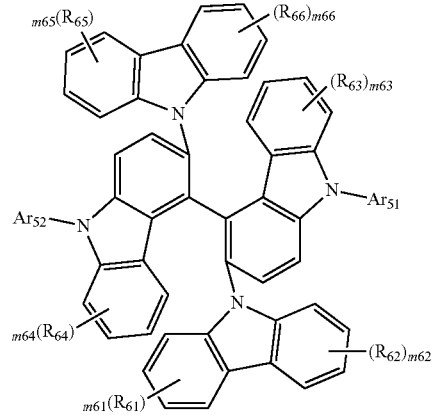

in Formulae 2-1 and 2-2, $R_{11}$, and $R_{12}$ are each, independently from one another, a hydrogen atom, a deuterium atom, a halogen atom, a substituted or unsubstituted amino group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, or combined with an adjacent group to form a ring;

m11 and m12 are each, independently from one another, an integer of 1 to 4; and $Ar_1$ and $Ar_2$ are each, independently from one another, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, wherein when $Z_2$ and $Z_3$ are represented by the Formula 2-1 and $Z_6$ and $Z_7$ are represented by the Formula 2-2, then $Z_2$ is not represented by nitrogen of the Formula 2-1 and $Z_6$ is not represented by nitrogen of the Formula 2-2.

16. The organic electroluminescence device of claim 15, wherein Formula 1 has a symmetrical structure about L.

17. The organic electroluminescence device of claim 15, wherein a compound of Formula 1 is represented by one or more compounds of the following Formulae 1-3 to 1-6:

[Formula 1-3]

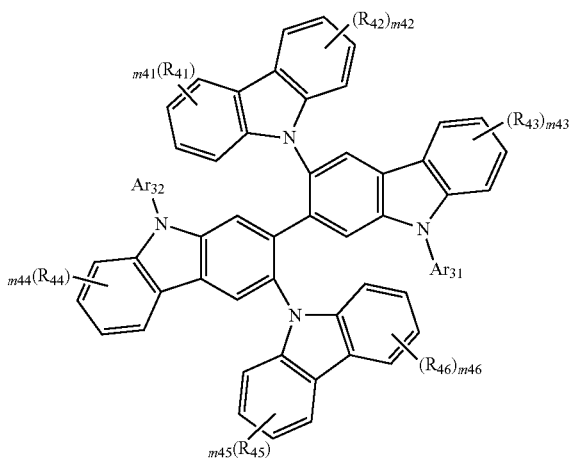

[Formula 1-6]

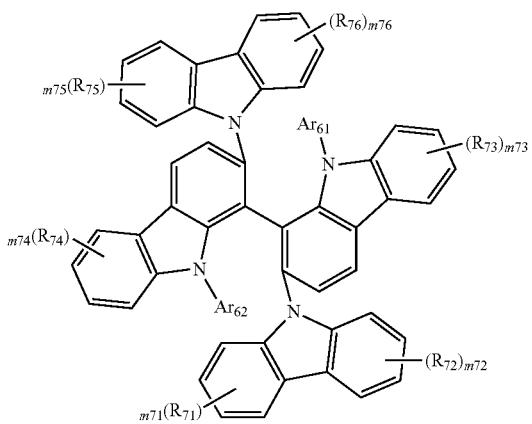

in Formulae 1-3 to 1-6, $R_{41}$ to $R_{46}$, $R_{51}$ to $R_{56}$, $R_{61}$ to $R_{66}$, and $R_{71}$ to $R_{76}$ are each, independently from one another, a hydrogen atom, a deuterium atom, a halogen atom, a substituted or unsubstituted amino group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, or combined with an adjacent group to form a ring;

m41 to m46, m51 to m56, m61 to m66, and m71 to m76 are each, independently from one another, an integer of 1 to 4; and $Ar_{31}$, $Ar_{32}$, $Ar_{41}$, $Ar_{42}$, $Ar_{51}$, $Ar_{52}$, $Ar_{61}$, and $Ar_{62}$ are each, independently from one another, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring.

18. The organic electroluminescence device of claim 15, wherein $R_1$ to $R_4$ are the same, and $Ar_1$ and $Ar_2$ are the same.

19. A polycyclic compound represented by the following Formula 1:

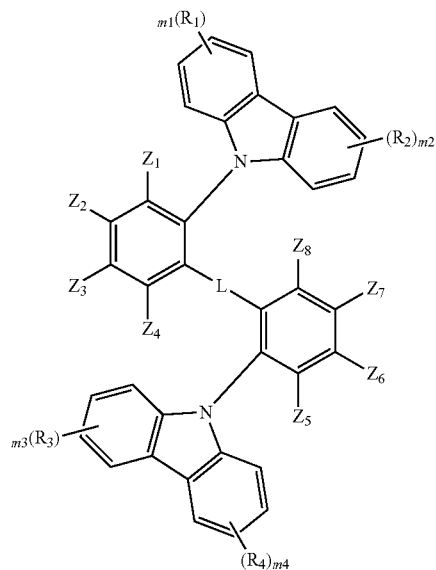

[Formula 1]

in Formula 1,

L is a direct linkage;

$R_1$ to $R_4$ are each, independently from one another, a hydrogen atom, a deuterium atom, a halogen atom, a substituted or unsubstituted amino group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, or combined with an adjacent group to form a ring;

m1 to m4 are each, independently from one another, an integer of 1 to 4;

$Z_1$ to $Z_8$ are each, independently from one another, a hydrogen atom, a deuterium atom, a halogen atom, a substituted or unsubstituted amino group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, or combined with an adjacent group to form a ring; and at least one pair among $Z_1$ and $Z_2$, $Z_2$ and $Z_3$, and $Z_3$ and $Z_4$ is represented by the following Formula 2-1, and at least one pair among $Z_5$ and $Z_6$, $Z_6$ and $Z_7$, and $Z_7$ and $Z_8$ is represented by the following Formula 2-2:

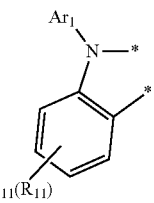

[Formula 2-1]

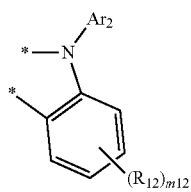

[Formula 2-2]

in Formulae 2-1 and 2-2, $R_{11}$ and $R_{12}$ are each, independently from one another, a hydrogen atom, a deuterium atom, a halogen atom, a substituted or unsubstituted amino group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, or combined with an adjacent group to form a ring;

m11 and m12 are each, independently from one another, an integer of 1 to 4; and $Ar_1$ and $Ar_2$ are each, independently from one another, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, wherein when $Z_2$ and $Z_3$ are represented by the Formula 2-1 and $Z_6$ and $Z_7$ are represented by the Formula 2-2, then $Z_2$ is not represented by nitrogen of the Formula 2-1 and $Z_6$ is not represented by nitrogen of the Formula 2-2.

20. The polycyclic compound of claim 19, wherein Formula 1 has a symmetrical structure about L.

21. The polycyclic compound of claim 19, wherein a compound of Formula 1 is represented by one or more compounds of the following Formulae 1-3 to 1-6:

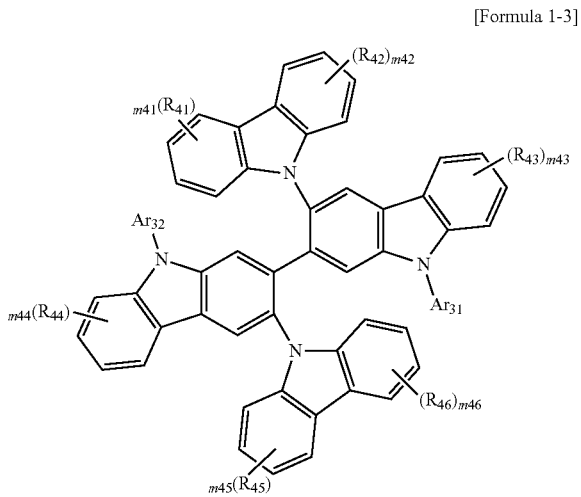

[Formula 1-3]

-continued

[Formula 1-4]

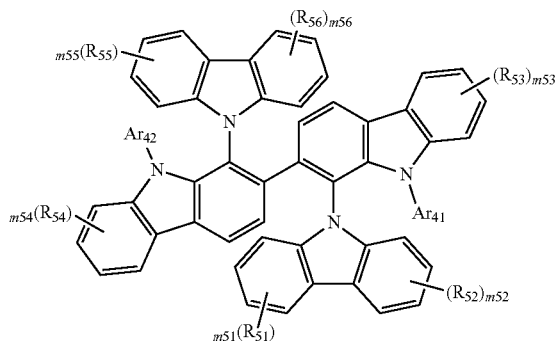

[Formula 1-5]

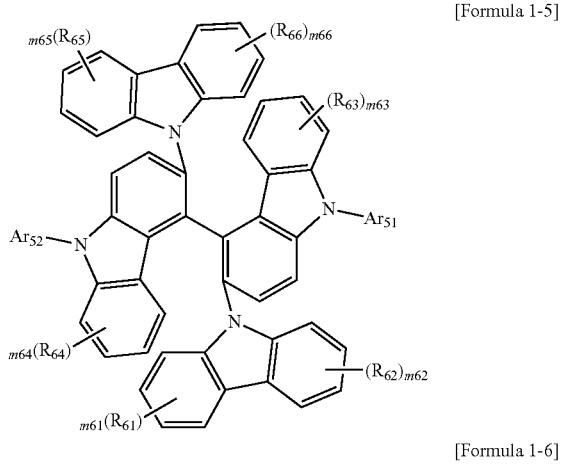

[Formula 1-6]

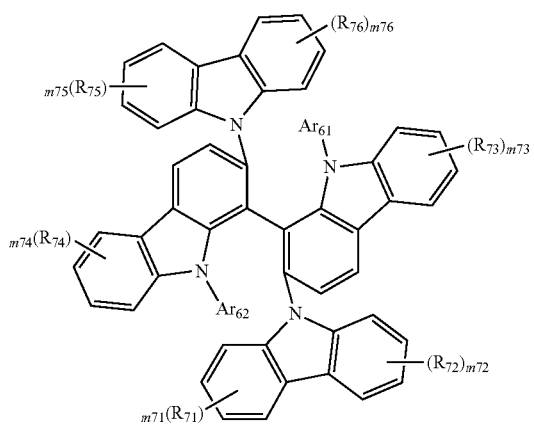

in Formulae 1-3 to 1-6,
$R_{41}$ to $R_{46}$, $R_{51}$ to $R_{56}$, $R_{61}$ to $R_{66}$, and $R_{71}$ to $R_{76}$ are each, independently from one another, a hydrogen atom, a deuterium atom, a halogen atom, a substituted or unsubstituted amino group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, or combined with an adjacent group to form a ring,
m41 to m46, m51 to m56, m61 to m66, and m71 to m76 are each, independently from one another, an integer of 1 to 4, and
$Ar_{31}$, $Ar_{32}$, $Ar_{41}$, $Ar_{42}$, $Ar_{51}$, $Ar_{52}$, $Ar_{61}$, and $Ar_{62}$ are each, independently from one another, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring.

22. The polycyclic compound of claim 19, wherein $R_1$ to $R_4$ are the same, and $Ar_1$ and $Ar_2$ are the same.

23. The polycyclic compound of claim 19, wherein a compound of Formula 1 comprises at least one compound from Compound Group 1:

[Compound Group 1]

3

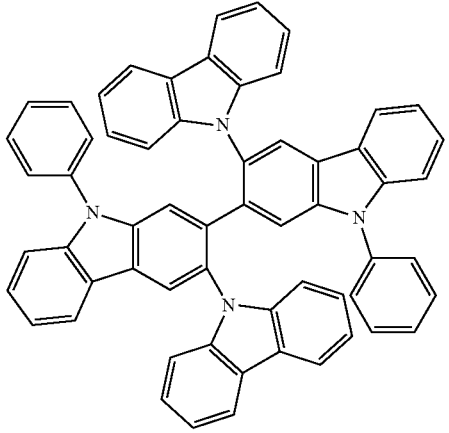

4

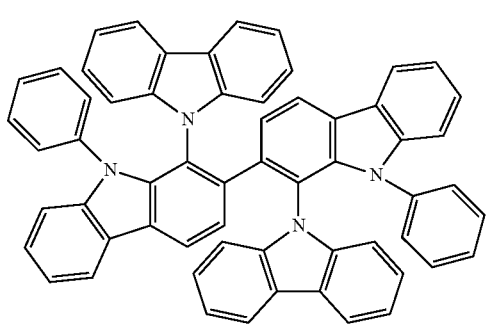

5

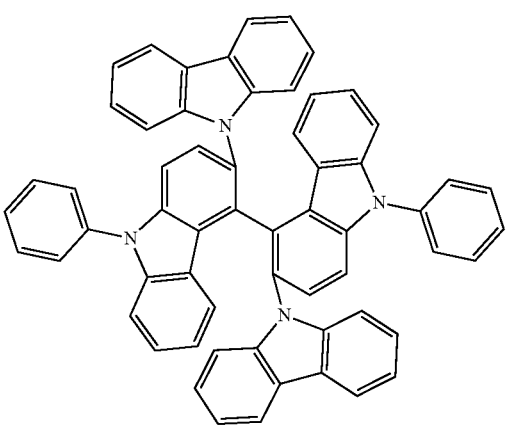

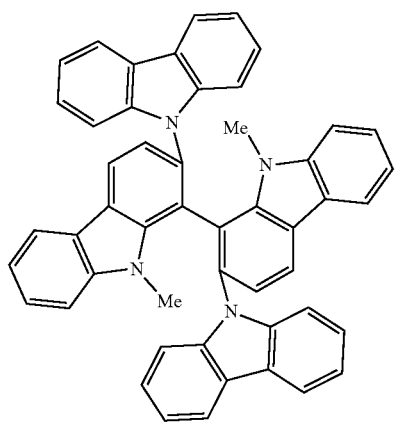
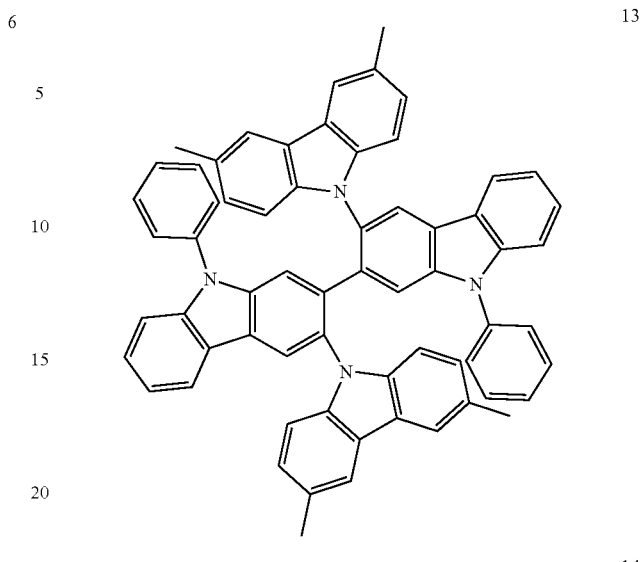
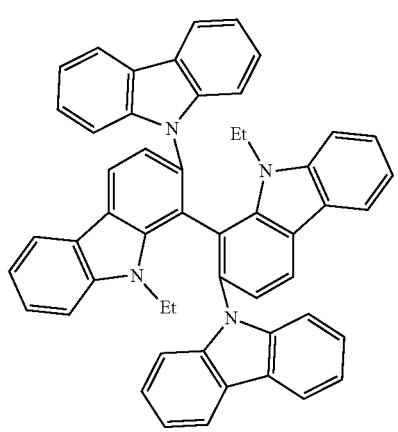
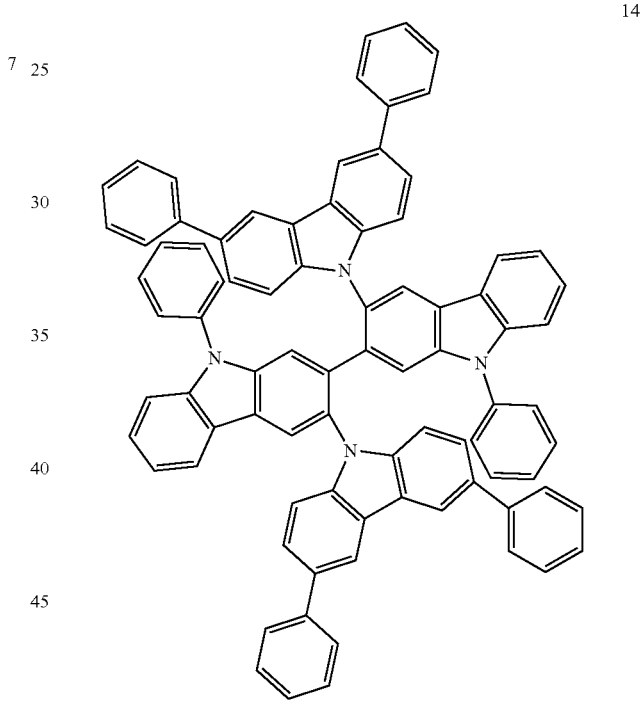
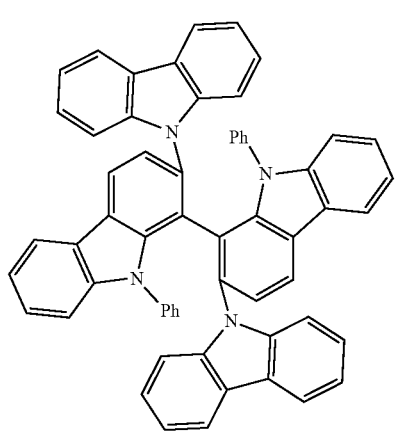
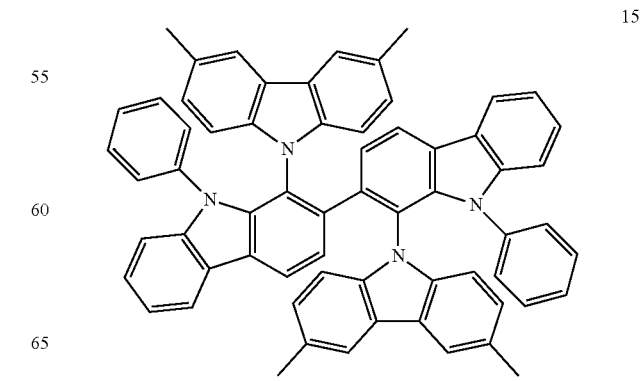

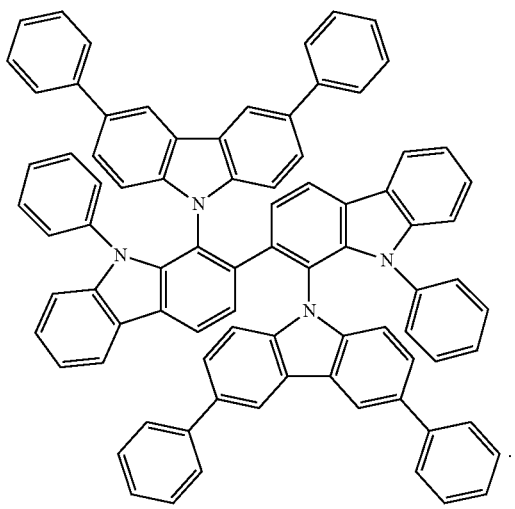
* * * * *